United States Patent
Naraoka et al.

(10) Patent No.: US 9,095,033 B2
(45) Date of Patent: Jul. 28, 2015

(54) ORGANIC ELECTROLUMINESCENCE ELEMENT

(75) Inventors: Ryo Naraoka, Sodegaura (JP); Hitoshi Kuma, Sodegaura (JP); Hiroyuki Saito, Sodegaura (JP); Chishio Hosokawa, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 675 days.

(21) Appl. No.: 13/389,703

(22) PCT Filed: Oct. 8, 2010

(86) PCT No.: PCT/JP2010/006043
§ 371 (c)(1),
(2), (4) Date: Feb. 9, 2012

(87) PCT Pub. No.: WO2011/043083
PCT Pub. Date: Apr. 14, 2011

(65) Prior Publication Data
US 2012/0138918 A1 Jun. 7, 2012

(30) Foreign Application Priority Data
Oct. 9, 2009 (JP) ................. 2009-235747

(51) Int. Cl.
| H01L 51/50 | (2006.01) |
| H05B 33/14 | (2006.01) |
| C09K 11/06 | (2006.01) |
| H01L 51/52 | (2006.01) |
| C09B 57/00 | (2006.01) |

(52) U.S. Cl.
CPC .............. *H05B 33/14* (2013.01); *C09B 57/001* (2013.01); *C09B 57/008* (2013.01); *C09K 11/06* (2013.01); *H01L 51/5237* (2013.01); *H01L 51/5262* (2013.01); *C09K 2211/1011* (2013.01); *H01L 2251/5315* (2013.01)

(58) Field of Classification Search
None
See application file for complete search history.

(56) References Cited

U.S. PATENT DOCUMENTS

| 5,891,554 A | 4/1999 | Hosokawa et al. |
| 6,850,003 B1 | 2/2005 | Pichler et al. |
| 7,102,282 B1 | 9/2006 | Yamada et al. |

(Continued)

FOREIGN PATENT DOCUMENTS

| EP | 1 624 503 A2 | 2/2006 |
| EP | 1 624 503 A3 | 2/2006 |

(Continued)

OTHER PUBLICATIONS

International Search Report issued Nov. 9, 2010, in PCT/JP2010/006043.

(Continued)

*Primary Examiner* — Gregory Clark
(74) *Attorney, Agent, or Firm* — Oblon, McClelland, Maier & Neustadt, L.L.P.

(57) ABSTRACT

A top-emission organic electroluminescence device (1) includes in order a first electrode (20), one or more organic layers (30B) including a blue-emitting layer (34B), a second electrode (40), and a capping layer (50), wherein the capping layer (50) is formed of a material that satisfies the expression "$n(\lambda=430\ nm)-n(\lambda=460\ nm)>0.08$" (where, $n(\lambda=x\ nm)$ indicates a refractive index at a wavelength of x nm) and has an extinction coefficient of 0.1 or less at a wavelength of 430 to 500 nm.

16 Claims, 8 Drawing Sheets

(56) References Cited

U.S. PATENT DOCUMENTS

| | | |
|---|---|---|
| 2004/0170863 A1* | 9/2004 | Kim et al. .................... 428/690 |
| 2006/0113907 A1 | 6/2006 | Im et al. |
| 2006/0121313 A1 | 6/2006 | Lee et al. |
| 2006/0175966 A1 | 8/2006 | Yamada et al. |
| 2007/0228943 A1 | 10/2007 | Yamada et al. |
| 2008/0023724 A1* | 1/2008 | Takeda et al. ................ 257/103 |
| 2010/0044689 A1* | 2/2010 | Nishimura et al. ............ 257/40 |
| 2010/0295446 A1 | 11/2010 | Yamamoto |

FOREIGN PATENT DOCUMENTS

| | | |
|---|---|---|
| EP | 1 670 084 A1 | 6/2006 |
| JP | 2001-516939 | 10/2001 |
| JP | 2006-156390 | 6/2006 |
| JP | 2006-164937 | 6/2006 |
| JP | 2006-302878 | 11/2006 |
| JP | 2007-103303 | 4/2007 |
| JP | 2009-181856 | 8/2009 |
| JP | 2010-244868 A | 10/2010 |
| WO | WO 01/39554 A1 | 5/2001 |
| WO | WO 2009/123277 A1 | 10/2009 |

OTHER PUBLICATIONS

Extended European Search Report issued Mar. 1, 2013, in Patent Application No. 10821758.9.

Office Action issued Jul. 1, 2014, in Japanese Patent Application No. 2011-535293.

* cited by examiner

ORGANIC ELECTROLUMINESCENCE ELEMENT

CROSS-REFERENCE TO RELATED APPLICATIONS

This application is a National Stage of PCT/JP2010/006043 filed on Oct. 8, 2010. This application is based upon and claims the benefit of priority to Japanese Patent Application No. 2009-235747 filed on Oct. 9, 2009.

TECHNICAL FIELD

The invention relates to an organic electroluminescence (EL) device. In particular, the invention relates to an organic EL device that may be used for a large television display panel or an illumination panel for which a reduction in power consumption is desired.

BACKGROUND ART

A method that improves the luminous efficiency of an organic EL device by adjusting the optical interference distance has been widely used. A method that adjusts the emission spectrum of a top-emission organic EL device by providing organic layers including an emitting layer between a metal electrode and a semitransparent metal electrode to form an optical resonator has been used as a means that improves the luminous efficiency, provides a sharp emission spectrum, and adjusts the peak wavelength. The length of the resonator is adjusted by changing the distance between the metal electrode and the semitransparent metal electrode. However, a change in carrier balance occurs when adjusting the optical interference by changing the thickness of the organic layer, so that a change in luminous efficiency occurs. Therefore, since the thickness of the organic layer is restricted by the conditions that maintain the carrier balance, the length of the resonator cannot be adjusted arbitrarily.

The optical interference distance of the top-emission organic EL device may be adjusted without causing a change in carrier balance by providing a thin film structure that allows an adjustment of the optical interference distance on the upper semitransparent metal electrode. In Patent Document 1, a resonator is formed on the upper electrode, and the peak wavelength is adjusted by adjusting the length of the resonator so that the optical length of the device is equal to an integral multiple of one half-wavelength (e.g., Fabry-Perot resonator). Patent Document 2 discloses a method that adjusts the optical interference distance by forming an optical adjustment layer having a thickness of several to several hundred nanometers on the upper electrode.

Accordingly, it is known in the art to adjust the optical interference distance of the top-emission organic EL device by providing a thin film structure having a thickness of several to several hundred nanometers or several micrometers on the upper electrode so that the optical length is equal to an integral multiple of one half-wavelength (e.g., Fabry-Perot resonator).

It has been proposed to improve the luminous efficiency of the top-emission organic EL device by providing a thin film structure referred to as a resonator, a protective film, a capping layer, or an optical adjustment layer on the upper semitransparent electrode. However, a method that achieves a high luminous efficiency, a sharp emission spectrum, and a short peak wavelength in the blue emission region (wavelength: 400 to 500 nm) has not been proposed. In particular, since blue light has a short wavelength and high energy as compared with green light and red light, it has been difficult to optimize the optical interference distance while maintaining the carrier balance.

The emission properties may be improved as follows by providing a thin film structure on the upper semitransparent electrode, for example. In Patent Document 2, an organic capping layer having a refractive index of 1.7 or more and a thickness of 600 angstroms is formed on the upper electrode of the top-emission die organic EL device so that emission from the red-emitting device and the green-emitting device is improved by a factor of about 1.5.

In Patent Document 3, an organic capping layer doped with Nile red is formed on the upper electrode of the top-emission organic EL device in order to suppress reflection of external light, and achieve high contrast due to an increase in luminous efficiency.

Patent Document 4 discloses a capping layer having an energy gap of 3.2 eV or more, a refractive index n of higher than 1.75, and an extinction coefficient k of less than 0.12. The capping layer having an energy gap of 3.2 eV (corresponding to a wavelength of 387 nm) or more exhibits excellent transparency over almost the entire visible region (wavelength: 380 to 780 nm). Therefore, the luminous efficiency increases due to the capping layer over the entire visible region.

Patent Document 4 states that a material having an energy gap of less than 3.2 eV is not desirable since such a material affects the blue wavelength.

RELATED-ART DOCUMENT

Patent Document

Patent Document 1: WO2001/039554
Patent Document 2: JP-A-2006-156390
Patent Document 3: JP-A-2007-103303
Patent Document 4: JP-A-2006-302878

SUMMARY OF THE INVENTION

An object of the invention is to improve the color reproducibility of an RGB image display. It is indispensable and a great challenge to decrease the CIEy value of the blue-emitting pixel in order to improve the color reproducibility of the RGB image display. The color reproducibility of the RGB image display is discussed below using the relationship between the chromaticity coordinates (x, y) in accordance with the CIE1931 standard and the wavelength of light (see FIG. 11).

The color reproducibility of the RGB image display increases as the degree of overlap of a triangle (S0) formed by connecting the red chromaticity coordinates (0.73, 0.26), the green chromaticity coordinates (0.27, 0.72), and the blue chromaticity coordinates (0.17, 0.01) and a triangle (S1) formed by connecting the chromaticity of the R pixel, the chromaticity of the G pixel, and the chromaticity of the B pixel increases. Since a red color shift and a green color shift rarely occur with respect to human luminosity, a change in CIEx value (red pixel) and CIEy value (green pixel) of the RGB image display does not pose a major problem. However, since a blue color shift easily occurs with respect to human luminosity, the RGB image display is required to reproduce an excellent blue color (light) (0.17, 0.01) (i.e., have a small CIEy value).

In Patent Document 2, an organic capping layer having a refractive index of 1.7 or more and a thickness of 600 angstroms is formed on the upper electrode of the top-emission die organic EL device so that emission from the red-emitting device and the green-emitting device is improved by a factor of about 1.5. However, since a decrease in CIEy value is insufficient to obtain an excellent blue color (light), the color reproducibility of the RGB image display is also insufficient.

In Patent Document 3, an organic capping layer doped with Nile red is formed on the upper electrode of the top-emission organic EL device in order to suppress reflection of external light, and achieve high contrast due to a high luminous efficiency. Patent Document 3 merely discloses a change in chromaticity in the red emission region due to the capping layer. Specifically, since the CIEy value cannot be decreased in the blue emission region in which it is difficult to adjust the chromaticity, the color reproducibility of the RGB image display is insufficient.

A capping layer material according to the invention exhibits an amount of change Δn in refractive index of more than 0.08 at a wavelength of 430 to 460 nm, and aims at causing a change in the blue emission region. The CIEy value of the emission spectrum decreases due to the refractive index dispersion of the capping layer in the blue emission region. It was found that a material that includes an anthracene derivative, a pyrene derivative, a fluorene derivative, or a dibenzofuran derivative is a promising capping layer material. The above related art does not disclose such a material.

Patent Document 4 states that a material having an energy gap of less than 3.2 eV is not desirable since such a material affects the blue wavelength. However, the capping layer material according to the invention has an extinction coefficient of 0.1 or less at a wavelength of 430 to 460 nm even if the energy gap is less than 3.2 eV. The CIEy value can be decreased while improving the luminous efficiency when the amount of change Δn in refractive index is more than 0.08. Note that the capping layer material used in Patent Document 4 is CBP, and the amount of change in refractive index ($n(\lambda=430$ nm$)-n(\lambda=460$ nm$)$) of CBP is about 0.03 to about 0.04.

Although emission can be improved by a factor of about 1.5 by providing an organic layer having a thickness of several to about 200 nm on the electrode, a method that can obtain emission having excellent chromaticity while achieving the above effect has not been proposed. In particular, since blue light has a short wavelength and high energy as compared with green light and red light, it is difficult to optically adjust blue emission. Therefore, development of a method that achieves a CIEy value of about 0.06 while improving the EL emission peak intensity in the blue emission region has been desired.

The invention provides the following organic EL device.
1. A top-emission organic electroluminescence device including in order a substrate, a first electrode, one or more organic layers including a blue-emitting layer, a second electrode, and a capping layer, wherein the capping layer is formed of a material that satisfies an expression (1) and has an extinction coefficient of 0.1 or less at a wavelength of 430 to 500 nm, $$n(\lambda=430 \text{ nm})-n(\lambda=460 \text{ nm})>0.08 \quad (1)$$

where, n(λ=x nm) indicates a refractive index at a wavelength of x nm.
2. The organic electroluminescence device according to 1, wherein the second electrode includes a metal.
3. The organic electroluminescence device according to 1 or 2, wherein the capping layer has a thickness of 200 nm or less.
4. The organic electroluminescence device according to any one of 1 to 3, wherein an emitting material included in the blue-emitting layer has a peak wavelength of a PL spectrum of 430 to 500 nm.
5. The organic electroluminescence device according to any one of 1 to 4, wherein the second electrode has a transmittance of light having a wavelength of 430 to 500 nm of 20% or more.
6. The organic electroluminescence device according to any one of 1 to 5, wherein the one or more organic layers further include a red-emitting layer and a green-emitting layer.
7. The organic electroluminescence device according to 6, wherein a blue pixel, a red pixel, and a green pixel are disposed on a common substrate, and the capping layer is provided common to the blue pixel, the red pixel, and the green pixel.
8. The organic electroluminescence device according to any one of 1 to 7, wherein the capping layer includes a compound selected from an aromatic hydrocarbon compound that satisfies the expression (1), has a molecular formula that indispensably includes a carbon atom and a hydrogen atom, and may be substituted with a substituent that may include an oxygen atom, a nitrogen atom, a fluorine atom, a silicon atom, a chlorine atom, a bromine atom, or an iodine atom, an aromatic heterocyclic compound that satisfies the expression (1), has a molecular formula that indispensably includes a carbon atom and a hydrogen atom, and may be substituted with a substituent that may include an oxygen atom, a nitrogen atom, a fluorine atom, a silicon atom, a chlorine atom, a bromine atom, or an iodine atom, and an amine compound that satisfies the expression (1), has a molecular formula that indispensably includes a carbon atom and a hydrogen atom, and may be substituted with a substituent that may include an oxygen atom, a nitrogen atom, a fluorine atom, a silicon atom, a chlorine atom, a bromine atom, or an iodine atom.
9. The organic electroluminescence device according to any one of 1 to 7, wherein the capping layer includes a compound shown by a formula (11),

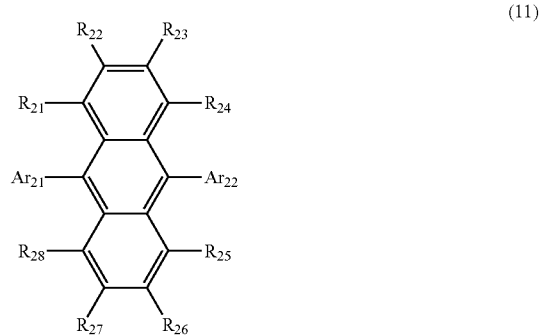

wherein $A_{21}$ and $A_{22}$ are independently a substituted or unsubstituted aromatic ring group having 6 to 60 carbon atoms, and $R_{21}$ to $R_{28}$ are independently a hydrogen atom, a substituted or unsubstituted aromatic ring group having 6 to 50 carbon atoms, a substituted or unsubstituted aromatic heterocyclic group having 5 to 50 atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxy group.

It is possible to suppress quenching due to the surface plasmon-mediated energy transfer, improve the EL emission peak intensity, and shift the peak wavelength to the short wavelength side by providing the capping layer that has an optimized wavelength dispersion of the refractive index on the electrode. This makes it possible to implement a blue-emitting device that has a small CIEy value.

When implementing an RGB image display that has a top-emission organic EL device as a pixel, a decrease in CIEy value of the blue-emitting pixel and an increase in luminous efficiency of the green pixel and the red pixel can be achieved at the same time by providing a capping layer having a wavelength dispersion of the refractive index optimized for the blue pixel in common to the blue pixel, the green pixel, and the red pixel.

DESCRIPTION OF THE EMBODIMENTS

First Embodiment

Figure 1:
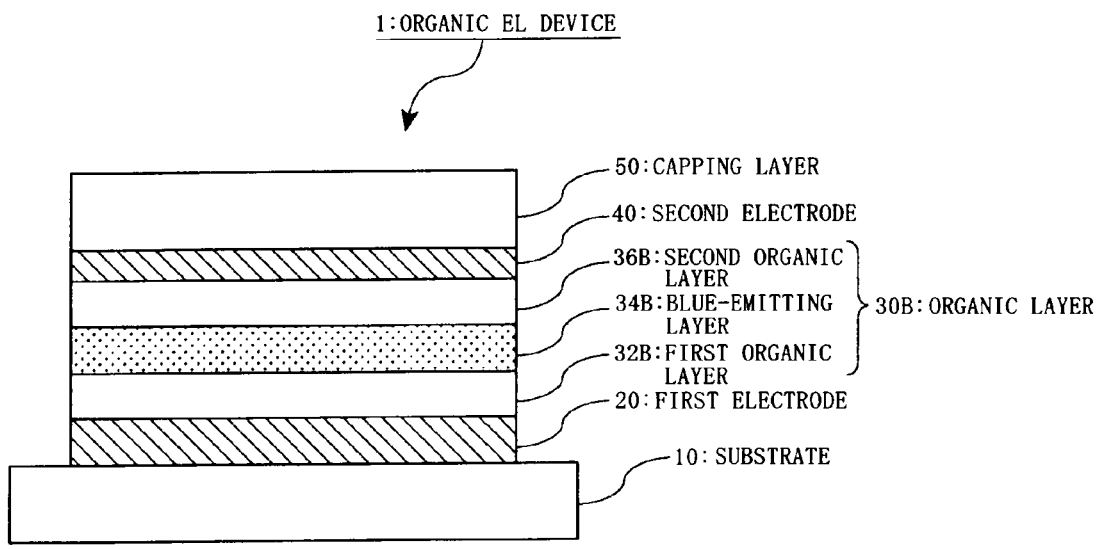
FIG. 1 is a view showing an organic EL device according to a first embodiment of the invention.

FIG. 1 is a schematic view showing an organic EL device according to a first embodiment of the invention. A top-emission organic EL device 1 shown in FIG. 1 sequentially includes a substrate 10, a first electrode 20, an organic layer 30B, a second electrode 40, and a capping layer 50, and light is outcoupled from the side of the capping layer 50. The organic layer 30B includes a first organic layer 32B, a blue-emitting layer 34B, and a second organic layer 36B in this embodiment. Note that the configuration of the organic layer 30B is not limited thereto, and various modifications may be appropriately made. The capping layer is provided to suppress extinction due to surface plasmons. The details of surface plasmons are described later. The thickness of the capping layer is preferably 200 nm or less. The thickness of the capping layer is more preferably 20 to 200 nm. The thickness of the capping layer is particularly preferably 40 to 140 nm. The peak wavelength of light emitted from the blue-emitting layer is normally 430 to 500 nm.

Note that the term "peak wavelength" used herein refers to a wavelength that has the maximum luminous intensity peak in an emission spectrum.

Each layer included in the organic EL device is described below.

(1) Capping Layer

A material for forming the capping layer is required to change in refractive index to a large extent in a blue emission region at a wavelength of 430 to 460 nm in order to adjust the chromaticity of the blue emission spectrum. The amount of change in wavelength dependence of the quenching efficiency due to surface plasmons increases as the amount of change in refractive index with respect to a change in wavelength increases. Therefore, the amount of change in emission spectrum increases as compared with a material having a small wavelength dispersion.

The amount of change in refractive index of the capping layer at a wavelength of 430 to 460 nm is more than 0.08, and preferably more than 0.08 and 1.0 or less. The amount of change in refractive index of the capping layer at a wavelength of 430 to 460 nm is more preferably 0.1 to 1.0, and still more preferably 0.12 to 1.0. It is preferable to use a material that has a normal dispersion that shows such an amount of change in refractive index.

If the amount of change in refractive index exceeds 1.0, the extinction coefficient may increase.

Therefore, a transparent electrode material or the like that changes in refractive index to only a small extent is not preferable since the effect of selectively outcoupling short-wavelength light is small.

The normal dispersion of refractive index refers to a relationship in which the refractive index increases as the frequency of light increases. Since the wavelength is the reciprocal of the frequency, the refractive index increases as the wavelength decreases. FIG. 5B shows the wavelength dispersion of the extinction coefficient (k) of several materials. In FIG. 5B, materials CA1, CA2, CA3, and CA4 exhibit normal dispersion.

The material for forming the capping layer is required to have no absorption in the blue region at a wavelength of 430 to 500 nm. Specifically, it is preferable that the extinction coefficient of the capping layer necessarily be 0.1 or less at a wavelength of 430 to 500 nm.

It is preferable that the material for forming the capping layer have no absorption in a visible region at a wavelength of 430 to 500 nm, and change in refractive index to a large extent in a blue emission region at a wavelength of 430 to 460 nm while exhibiting normal dispersion.

A material for forming the RGB common capping layer is required to have no absorption in a visible region at a wavelength of 430 to 780 nm. Specifically, it is preferable that the extinction coefficient of the capping layer necessarily be 0.1 or less at a wavelength of 430 to 780 nm.

The capping layer according to the invention may be formed using a compound that has a molecular formula that indispensably includes a carbon atom and a hydrogen atom, and may be substituted with a substituent that may include an oxygen atom, a nitrogen atom, a fluorine atom, a silicon atom, a chlorine atom, a bromine atom, or an iodine atom.

The following compounds are preferable as the material for the capping layer.

(i) Aromatic hydrocarbon compound that has a molecular formula that indispensably includes a carbon atom and a hydrogen atom, and may be substituted with a substituent that may include an oxygen atom, a nitrogen atom, a fluorine atom, a silicon atom, a chlorine atom, a bromine atom, or an iodine atom (ii) Aromatic heterocyclic compound that has a molecular formula that indispensably includes a carbon atom and a hydrogen atom, and may be substituted with a substituent that may include an oxygen atom, a nitrogen atom, a fluorine atom, a silicon atom, a chlorine atom, a bromine atom, or an iodine atom (iii) Amine compound that has a molecular formula that indispensably includes a carbon atom and a hydrogen atom, and may be substituted with a substituent that may include an oxygen atom, a nitrogen atom, a fluorine atom, a silicon atom, a chlorine atom, a bromine atom, or an iodine atom The following compounds are more preferable as the material for the capping layer.

(a) Aromatic hydrocarbon compound as defined in (i) that has 6 to 100 carbon atoms (b) Aromatic hydrocarbon compound as defined in (i) that may be substituted with a linear or branched alkyl group having 1 to 30 carbon atoms, a cycloalkyl group having 3 to 30 carbon atoms, an aryl group having 6 to 30 carbon atoms, an alkoxy group having 1 to 30 carbon atoms, an aryloxy group having 6 to 30 carbon atoms, an aralkyl group having 7 to 30 carbon atoms, a fluoroalkyl group having 1 to 20 carbon atoms, a trialkylsilyl group having 3 to 30 carbon atoms, a dialkylarylsilyl group having 8 to 30 carbon atoms, an alkylbisarylsilyl group having 13 to 40 carbon atoms, a triarylsilyl group having 18 to 50 carbon atoms, an alkoxycarbonyl group having 1 to 30 carbon atoms, a carboxyl group, a halogen atom, a cyano group, a nitro group, or a hydroxy group (c) Aromatic hydrocarbon compound as defined in (i) that is a combination of residues selected from a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, and a monovalent residue, or a divalent or higher valent residue of a perylene derivative (d) Aromatic heterocyclic compound as defined in (ii) that has 4 to 100 carbon atoms (e) Aromatic heterocyclic compound as defined in (ii) that has 4 to 100 carbon atoms, and includes a heterocyclic ring that includes at least an oxygen atom or a sulfur atom as a heteroatom (f) Aromatic heterocyclic compound as defined in (ii) that has 4 to 100 carbon atoms, and includes a 6-membered heterocyclic structure that includes only a nitrogen atom as a heteroatom (g) Aromatic heterocyclic compound as defined in (i) that may be substituted with a linear or branched alkyl group having 1 to 30 carbon atoms, a cycloalkyl group having 3 to 30 carbon atoms, an aryl group having 6 to 60 carbon atoms, an alkoxy group having 1 to 30 carbon atoms, an aryloxy group having 6 to 60 carbon atoms, an aralkyl group having 7 to 60 carbon atoms, a fluoroalkyl group having 1 to 20 carbon atoms, a trialkylsilyl group having 3 to 30 carbon atoms, a dialkylarylsilyl group having 8 to 30 carbon atoms, an alkylbisarylsilyl group having 13 to 60 carbon atoms, a triarylsilyl group having 18 to 70 carbon atoms, an alkoxycarbonyl group having 1 to 30 carbon atoms, a bisarylamino group having 6 to 60 carbon atoms, a diarylamino group having 1 to 30 carbon atoms, a carboxyl group, a halogen atom, a cyano group, a nitro group, or a hydroxy group (h) Aromatic heterocyclic compound as defined in (i) that is a combination of residues selected from a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, a monovalent residue, or a divalent or higher valent residue of a perylene derivative, a monovalent residue, or a divalent or higher valent residue of a furan derivative, a monovalent residue, or a divalent or higher valent residue of a benzofuran derivative, a monovalent residue, or a divalent or higher valent residue of a dibenzofuran derivative, a monovalent residue, or a divalent or higher valent residue of a thiophene derivative, a monovalent residue, or a divalent or higher valent residue of a benzothiophene derivative, a monovalent residue, or a divalent or higher valent residue of a dibenzothiophene derivative, a monovalent residue, or a divalent or higher valent residue of a quinoline derivative, a monovalent residue, or a divalent or higher valent residue of isoquinoline, a monovalent residue, or a divalent or higher valent residue of quinazoline, a monovalent residue, or a divalent or higher valent residue of cinnoline, a monovalent residue, or a divalent or higher valent residue of quinoxaline, a monovalent residue, or a divalent or higher valent residue of phthalazine, a monovalent residue, or a divalent or higher valent residue of acridine, a monovalent residue, or a divalent or higher valent residue of phenanthriazine, a monovalent residue, or a divalent or higher valent residue of xanthene, a monovalent residue, or a divalent or higher valent residue of phenazine, a monovalent residue, or a divalent or higher valent residue of phenothiazine, a monovalent residue, or a divalent or higher valent residue of phenoxathiin, a monovalent residue, or a divalent or higher valent residue of phenoxazine, a monovalent residue, or a divalent or higher valent residue of thianthrene, a monovalent residue, or a divalent or higher valent residue of chroman, a monovalent residue, or a divalent or higher valent residue of isochroman, a monovalent residue, or a divalent or higher valent residue of carbazole (a case where only a carbazol-9-yl heterocyclic structure is present is excluded), and a monovalent residue, or a divalent or higher valent residue of benzimidazole (a case where only a benzimidazol-2-yl heterocyclic structure is present is excluded)

(i) Aromatic heterocyclic compound as defined in (i) that indispensably includes a carbazolyl derivative residue (the bonding site is position 1, 2, 3, or 4), and is a combination of residues selected from a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, a monovalent residue, or a divalent or higher valent residue of a perylene derivative, a monovalent residue, or a divalent or higher valent residue of a furan derivative, a monovalent residue, or a divalent or higher valent residue of a benzofuran derivative, a monovalent residue, or a divalent or higher valent residue of a dibenzofuran derivative, a monovalent residue, or a divalent or higher valent residue of a thiophene derivative, a monovalent residue, or a divalent or higher valent residue of a benzothiophene derivative, a monovalent residue, or a divalent or higher valent residue of a dibenzothiophene derivative, a monovalent residue, or a divalent or higher valent residue of a quinoline derivative, a monovalent residue, or a divalent or higher valent residue of isoquinoline, a monovalent residue, or a divalent or higher valent residue of quinazoline, a monovalent residue, or a divalent or higher valent residue of cinnoline, a monovalent residue, or a divalent or higher valent residue of quinoxaline, a monovalent residue, or a divalent or higher valent residue of phthalazine, a monovalent residue, or a divalent or higher valent residue of acridine, a monovalent residue, or a divalent or higher valent residue of phenanthriazine, a monovalent residue, or a divalent or higher valent residue of xanthene, a monovalent residue, or a divalent or higher valent residue of phenazine, a monovalent residue, or a divalent or higher valent residue of phenothiazine, a monovalent residue, or a divalent or higher valent residue of phenoxathiin, a monovalent residue, or a divalent or higher valent residue of phenoxazine, a monovalent residue, or a divalent or higher valent residue of thianthrene, a monovalent residue, or a divalent or higher valent residue of chroman, a monovalent residue, or a divalent or higher valent residue of isochroman, a monovalent residue, or a divalent or higher valent residue of carbazole, and a monovalent residue, or a divalent or higher valent residue of benzimidazole (j) Aryldiamine compound as defined in (iii) that has 44 to 150 (preferably 60 to 150) carbon atoms (k) Triarylamine compound as defined in (iii) that has 18 to 100 carbon atoms, and includes an aryl group that is substituted with at least one aromatic hetero ring (l) Triarylamine compound as defined in (iii) that is a combination of residues selected from a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, a monovalent residue, or a divalent or higher valent residue of a perylene derivative, a monovalent residue, or a divalent or higher valent residue of a furan derivative, a monovalent residue, or a divalent or higher valent residue of a benzofuran derivative, a monovalent residue, or a divalent or higher valent residue of a dibenzofuran derivative, a monovalent residue, or a divalent or higher valent residue of a thiophene derivative, a monovalent residue, or a divalent or higher valent residue of a benzothiophene derivative, a monovalent residue, or a divalent or higher valent residue of a dibenzothiophene derivative, a monovalent residue, or a divalent or higher valent residue of a quinoline derivative, a monovalent residue, or a divalent or higher valent residue of isoquinoline, a monovalent residue, or a divalent or higher valent residue of quinazoline, a monovalent residue, or a divalent or higher valent residue of cinnoline, a monovalent residue, or a divalent or higher valent residue of quinoxaline, a monovalent residue, or a divalent or higher valent residue of phthalazine, a monovalent residue, or a divalent or higher valent residue of acridine, a monovalent residue, or a divalent or higher valent residue of phenanthriazine, a monovalent residue, or a divalent or higher valent residue of xanthene, a monovalent residue, or a divalent or higher valent residue of phenazine, a monovalent residue, or a divalent or higher valent residue of phenothiazine, a monovalent residue, or a divalent or higher valent residue of phenoxathiin, a monovalent residue, or a divalent or higher valent residue of phenoxazine, a monovalent residue, or a divalent or higher valent residue of thianthrene, a monovalent residue, or a divalent or higher valent residue of chroman, a monovalent residue, or a divalent or higher valent residue of isochroman, a monovalent residue, or a divalent or higher valent residue of carbazole (a case where only a carbazol-9-yl heterocyclic structure is present is excluded), and a monovalent residue, or a divalent or higher valent residue of benzimidazole (a case where only a benzimidazol-2-yl heterocyclic structure is present is excluded)

(m) Triarylamine compound as defined in (iii) that indispensably includes a carbazolyl derivative residue (the bonding site is position 1, 2, 3, or 4), and is a combination of residues selected from a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, a monovalent residue, or a divalent or higher valent residue of a perylene derivative, a monovalent residue, or a divalent or higher valent residue of a furan derivative, a monovalent residue, or a divalent or higher valent residue of a benzofuran derivative, a monovalent residue, or a divalent or higher valent residue of a dibenzofuran derivative, a monovalent residue, or a divalent or higher valent residue of a thiophene derivative, a monovalent residue, or a divalent or higher valent residue of a benzothiophene derivative, a monovalent residue, or a divalent or higher valent residue of a dibenzothiophene derivative, a monovalent residue, or a divalent or higher valent residue of a quinoline derivative, a monovalent residue, or a divalent or higher valent residue of isoquinoline, a monovalent residue, or a divalent or higher valent residue of quinazoline, a monovalent residue, or a divalent or higher valent residue of cinnoline, a monovalent residue, or a divalent or higher valent residue of quinoxaline, a monovalent residue, or a divalent or higher valent residue of phthalazine, a monovalent residue, or a divalent or higher valent residue of acridine, a monovalent residue, or a divalent or higher valent residue of phenanthriazine, a monovalent residue, or a divalent or higher valent residue of xanthene, a monovalent residue, or a divalent or higher valent residue of phenazine, a monovalent residue, or a divalent or higher valent residue of phenothiazine, a monovalent residue, or a divalent or higher valent residue of phenoxathiin, a monovalent residue, or a divalent or higher valent residue of phenoxazine, a monovalent residue, or a divalent or higher valent residue of thianthrene, a monovalent residue, or a divalent or higher valent residue of chroman, a monovalent residue, or a divalent or higher valent residue of isochroman, a monovalent residue, or a divalent or higher valent residue of carbazole, and a monovalent residue, or a divalent or higher valent residue of benzimidazole (n) Aryldiamine compound as defined in (iii) that has 30 to 100 carbon atoms, and includes an aryl group that is substituted with at least one aromatic hetero ring (o) Aryldiamine compound as defined in (iii) that is a combination of residues selected from a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, a monovalent residue, or a divalent or higher valent residue of a perylene derivative, a monovalent residue, or a divalent or higher valent residue of a furan derivative, a monovalent residue, or a divalent or higher valent residue of a benzofuran derivative, a monovalent residue, or a divalent or higher valent residue of a dibenzofuran derivative, a monovalent residue, or a divalent or higher valent residue of a thiophene derivative, a monovalent residue, or a divalent or higher valent residue of a benzothiophene derivative, a monovalent residue, or a divalent or higher valent residue of a dibenzothiophene derivative, a monovalent residue, or a divalent or higher valent residue of a quinoline derivative, a monovalent residue, or a divalent or higher valent residue of isoquinoline, a monovalent residue, or a divalent or higher valent residue of quinazoline, a monovalent residue, or a divalent or higher valent residue of cinnoline, a monovalent residue, or a divalent or higher valent residue of quinoxaline, a monovalent residue, or a divalent or higher valent residue of phthalazine, a monovalent residue, or a divalent or higher valent residue of acridine, a monovalent residue, or a divalent or higher valent residue of phenanthriazine, a monovalent residue, or a divalent or higher valent residue of xanthene, a monovalent residue, or a divalent or higher valent residue of phenazine, a monovalent residue, or a divalent or higher valent residue of phenothiazine, a monovalent residue, or a divalent or higher valent residue of phenoxathiin, a monovalent residue, or a divalent or higher valent residue of phenoxazine, a monovalent residue, or a divalent or higher valent residue of thianthrene, a monovalent residue, or a divalent or higher valent residue of chroman, a monovalent residue, or a divalent or higher valent residue of isochroman, a monovalent residue, or a divalent or higher valent residue of carbazole, and a monovalent residue, or a divalent or higher valent residue of benzimidazole A compound shown by the following formula (11) is still more preferable as the material for the capping layer.

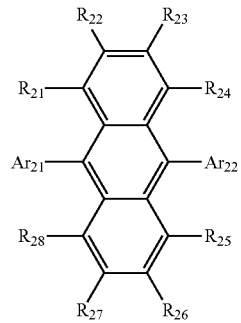

(11)

wherein Ar$_{21}$ and Ar$_{22}$ are independently a substituted or unsubstituted aromatic ring group having 6 to 60 carbon atoms (e.g., a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, or a monovalent residue, or a divalent or higher valent residue of a perylene derivative), R$_{21}$ to R$_{28}$ are independently a hydrogen atom, a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthriazine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), a substituted or unsubstituted alkyl group having 1 to 50 carbon atoms (e.g., methyl group, ethyl group, n-propyl group, isopropyl group, n-butyl group, sec-butyl group, or tert-butyl group), a substituted or unsubstituted cycloalkyl group (e.g., cyclopentyl group, cyclohexyl group, or cycloheptyl group), a substituted or unsubstituted alkoxy group having 1 to 50 carbon atoms (e.g., methoxy group or ethoxy group), a substituted or unsubstituted aralkyl group having 6 to 50 carbon atoms (e.g., benzyl group), a substituted or unsubstituted aryloxy group having 5 to 50 atoms (e.g., phenoxy group), a substituted or unsubstituted alkoxycarbonyl group having 1 to 50 carbon atoms (e.g., methylcarbonyl group), a substituted or unsubstituted silyl group (e.g., trialkylsilyl group (e.g., trimethylsilyl group or tert-butyldimethylsilyl group) or arylalkylsilyl group (e.g., phenyldimethylsilyl group or tert-butyldiphenylsilyl group)), a carboxyl group, a halogen atom (e.g., fluorine atom), a cyano group, a nitro group, or a hydroxy group.

Adjacent substituents among R$_{22}$ to R$_{28}$ may form a fused ring (e.g., fused benzo ring or fused naphtho ring).

Examples of a substituent include an aromatic ring group having 6 to 60 carbon atoms (e.g., phenyl group, naphthyl group, biphenyl group, terphenyl group, naphthylphenyl group, phenylnaphthyl group, 9,9-dimethylfluorenyl group, and monovalent residue of phenanthrene), an aromatic heterocyclic group having 5 to 50 atoms, and an alkyl group having 1 to 50 carbon atoms (e.g., methyl group, ethyl group, n-propyl group, isopropyl group, n-butyl group, sec-butyl group, and tert-butyl group).

A compound shown by the following formula (12) is also preferable as the material for the capping layer.

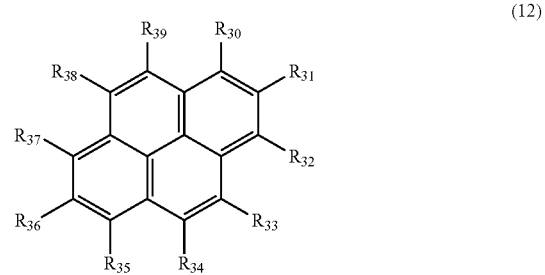

(12)

wherein R$_{30}$ to R$_{39}$ are independently a hydrogen atom, a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthriazine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), a substituted or unsubstituted alkyl group having 1 to 50 carbon atoms (e.g., methyl group, ethyl group, n-propyl group, isopropyl group, n-butyl group, sec-butyl group, or tert-butyl group), a substituted or unsubstituted cycloalkyl group (e.g., cyclopentyl group, cyclohexyl group, or cycloheptyl group), a substituted or unsubstituted alkoxy group having 1 to 50 carbon atoms (e.g., methoxy group or ethoxy group), a substituted or unsubstituted aralkyl group having 6 to 50 carbon atoms (e.g., benzyl group), a substituted or unsubstituted aryloxy group having 5 to 50 atoms (e.g., phenoxy group), a substituted or unsubstituted alkoxycarbonyl group having 1 to 50 carbon atoms (e.g., methylcarbonyl group), a substituted or unsubstituted silyl group (e.g., trialkylsilyl group (e.g., trimethylsilyl group or tert-butyldimethylsilyl group) or arylalkylsilyl group (e.g., phenyldimethylsilyl group or tert-butyldiphenylsilyl group)), a carboxyl group, a halogen atom (e.g., fluorine atom), a cyano group, a nitro group, or a hydroxy group.

Adjacent substituents among $R_{30}$ to $R_{39}$ may form a fused ring (e.g., fused benzo ring or fused naphtho ring).

Examples of a substituent include an aromatic ring group having 6 to 60 carbon atoms (e.g., phenyl group, naphthyl group, biphenyl group, terphenyl group, naphthylphenyl group, phenylnaphthyl group, 9,9-dimethylfluorenyl group, and monovalent residue of phenanthrene), an aromatic heterocyclic group having 5 to 50 atoms, and an alkyl group having 1 to 50 carbon atoms (e.g., methyl group, ethyl group, n-propyl group, isopropyl group, n-butyl group, sec-butyl group, and tert-butyl group).

A compound shown by the following formula (13) is also preferable as the material for the capping layer.

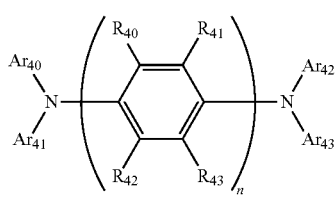

(13)

wherein n is an integer from 2 to 4 (preferably 2), $Ar_{40}$ to $Ar_{43}$ are independently a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), or a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthriazine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), and $R_{41}$ to $R_{43}$ are independently a hydrogen atom, a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthriazine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), a substituted or unsubstituted alkyl group having 1 to 50 carbon atoms (e.g., methyl group, ethyl group, n-propyl group, isopropyl group, n-butyl group, sec-butyl group, or tert-butyl group), a substituted or unsubstituted cycloalkyl group (e.g., cyclopentyl group, cyclohexyl group, or cycloheptyl group), a substituted or unsubstituted alkoxy group having 1 to 50 carbon atoms (e.g., methoxy group or ethoxy group), a substituted or unsubstituted aralkyl group having 6 to 50 carbon atoms (e.g., benzyl group), a substituted or unsubstituted aryloxy group having 5 to 50 atoms (e.g., phenoxy group), a substituted or unsubstituted alkoxycarbonyl group having 1 to 50 carbon atoms (e.g., methylcarbonyl group), a substituted or unsubstituted silyl group (e.g., trialkylsilyl group (e.g., trimethylsilyl group or tert-butyldimethylsilyl group) or arylalkylsilyl group (e.g., phenyldimethylsilyl group or tert-butyldiphenylsilyl group)), a carboxyl group, a halogen atom (e.g., fluorine atom), a cyano group, a nitro group, or a hydroxy group.

Adjacent substituents among $R_{40}$ to $R_{43}$ may form a fused ring (e.g., fused benzo ring or fused naphtho ring). A plurality of $R_{40}$ to $R_{43}$ may either identical or different. One of $R_{41}$ and one of $R_{40}$ and/or one of $R_{43}$ and one of $R_{42}$ may form a cyclic structure (e.g., fluorene structure) that may be substituted with a substituent (e.g., dimethyl group or a cyclohexylidine group).

Examples of a substituent include an aromatic ring group having 6 to 60 carbon atoms (e.g., phenyl group, naphthyl group, biphenyl group, terphenyl group, naphthylphenyl group, phenylnaphthyl group, 9,9-dimethylfluorenyl group, and monovalent residue of phenanthrene), an aromatic heterocyclic group having 5 to 50 atoms, and an alkyl group having 1 to 50 carbon atoms (e.g., methyl group, ethyl group, n-propyl group, isopropyl group, n-butyl group, sec-butyl group, and tert-butyl group).

A compound shown by the following formula (14) is also preferable as the material for the capping layer.

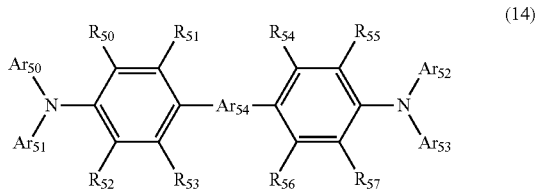

(14)

wherein $Ar_{50}$ to $Ar_{53}$ are independently a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), or a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthriazine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), $Ar_{54}$ is a substituted or unsubstituted aromatic heterocyclic group having 5 to 50 atoms (e.g., a divalent residue of a furan derivative, a divalent residue of a benzofuran derivative, a divalent residue of a dibenzofuran derivative, a divalent residue of a thiophene derivative, a divalent residue of a benzothiophene derivative, a divalent residue of a dibenzothiophene derivative, a divalent residue of a quinoline derivative, a divalent residue of isoquinoline, a divalent residue of quinazoline, a divalent residue of cinnoline, a divalent residue of quinoxaline, a divalent residue of phthalazine, a divalent residue of acridine, a divalent residue of phenanthriazine, a divalent residue of xanthene, a divalent residue of phenazine, a divalent residue of phenothiazine, a divalent residue of phenoxathiin, a divalent residue of phenoxazine, a divalent residue of thianthrene, a divalent residue of chroman, a divalent residue of isochroman, a divalent residue of carbazole, or a divalent residue of benzimidazole), and $R_{50}$ to $R_{57}$ are independently a hydrogen atom, a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthriazine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), a substituted or unsubstituted alkyl group having 1 to 50 carbon atoms (e.g., methyl group, ethyl group, n-propyl group, isopropyl group, n-butyl group, sec-butyl group, or tert-butyl group), a substituted or unsubstituted cycloalkyl group (e.g., cyclopentyl group, cyclohexyl group, or cycloheptyl group), a substituted or unsubstituted alkoxy group having 1 to 50 carbon atoms (e.g., methoxy group or ethoxy group), a substituted or unsubstituted aralkyl group having 6 to 50 carbon atoms (e.g., benzyl group), a substituted or unsubstituted aryloxy group having 5 to 50 atoms (e.g., phenoxy group), a substituted or unsubstituted alkoxycarbonyl group having 1 to 50 carbon atoms (e.g., methylcarbonyl group), a substituted or unsubstituted silyl group (e.g., trialkylsilyl group (e.g., trimethylsilyl group or tert-butyldimethylsilyl group) or arylalkylsilyl group (e.g., phenyldimethylsilyl group or tert-butyldiphenylsilyl group)), a carboxyl group, a halogen atom (e.g., fluorine atom), a cyano group, a nitro group, or a hydroxy group.

Adjacent substituents among $R_{50}$ to $R_{57}$ may form a fused ring (e.g., fused benzo ring or fused naphtho ring).

Examples of a substituent include an aromatic ring group having 6 to 60 carbon atoms (e.g., phenyl group, naphthyl group, biphenyl group, terphenyl group, naphthylphenyl group, phenylnaphthyl group, 9,9-dimethylfluorenyl group, and monovalent residue of phenanthrene), an aromatic heterocyclic group having 5 to 50 atoms, and an alkyl having 1 to 50 carbon atoms (e.g., methyl group, ethyl group, n-propyl group, isopropyl group, n-butyl group, sec-butyl group, and tert-butyl group).

A compound shown by the following formula (15) is also preferable as the material for the capping layer.

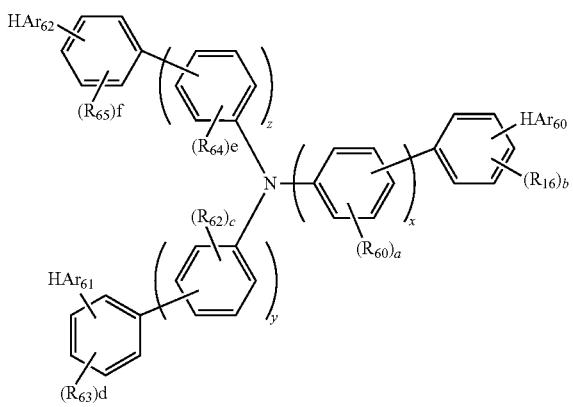

(15)

wherein $R_{60}$ to $R_{65}$ are independently a hydrogen atom, a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthridine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), a substituted or unsubstituted alkyl group having 1 to 50 carbon atoms (e.g., methyl group, ethyl group, n-propyl group, isopropyl group, n-butyl group, sec-butyl group, or tert-butyl group), a substituted or unsubstituted cycloalkyl group (e.g., cyclopentyl group, cyclohexyl group, or cycloheptyl group), a substituted or unsubstituted alkoxy group having 1 to 50 carbon atoms (e.g., methoxy group or ethoxy group), a substituted or unsubstituted aralkyl group having 6 to 50 carbon atoms (e.g., benzyl group), a substituted or unsubstituted aryloxy group having 5 to 50 atoms (e.g., phenoxy group), a substituted or unsubstituted alkoxycarbonyl group having 1 to 50 carbon atoms (e.g., methylcarbonyl group), a substituted or unsubstituted silyl group (e.g., trialkylsilyl group (e.g., trimethylsilyl group or tert-butyldimethylsilyl group) or arylalkylsilyl group (e.g., phenyldimethylsilyl group or tert-butyldiphenylsilyl group)), a carboxyl group, a halogen atom (e.g., fluorine atom), a cyano group, a nitro group, or a hydroxy group, a is an integer from 1 to 4, b is an integer from 1 to 4, c is an integer from 1 to 4, d is an integer from 0 to 4, e is an integer from 0 to 4, f is an integer from 0 to 4, x is an integer from 0 to 3, y is an integer from 0 to 3, z is an integer from 0 to 3, provided that a plurality of $R_{60}$ may be identical or different when a is an integer equal to or larger than 2, a plurality of $R_{61}$ may be identical or different when b is an integer equal to or larger than 2, a plurality of $R_{62}$ may be identical or different when c is an integer equal to or larger than 2, a plurality of $R_{63}$ may be identical or different when d is an integer equal to or larger than 2, a plurality of $R_{64}$ may be identical or different when e is an integer equal to or larger than 2, a plurality of $R_{65}$ may be identical or different when f is an integer equal to or larger than 2, a plurality of phenylene derivatives may be identical or different when x is an integer equal to or larger than 2, a plurality of phenylene derivatives may be identical or different when y is an integer equal to or larger than 2, a plurality of phenylene derivatives may be identical or different when z is an integer equal to or larger than 2, adjacent substituents among a plurality of $R_{60}$ to $R_{65}$ may form a fused ring (e.g., fused benzo ring or fused naphtho ring), and $HAr_{60}$, $HAr_{61}$, and $HAr_{62}$ are independently a hydrogen atom, a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthridine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole, provided that a carbazol-9-yl group is excluded), or a substituent shown by the following formula (17), provided that at least one of $HAr_{60}$, $HAr_{61}$, and $HAr_{62}$ is a substituted or unsubstituted aromatic heterocyclic group having 5 to 50 atoms (provided that a carbazol-9-yl group is excluded), or the substituent shown by the formula (17).

Examples of a substituent include an aromatic ring group having 6 to 60 carbon atoms (e.g., phenyl group, naphthyl group, biphenyl group, terphenyl group, naphthylphenyl group, phenylnaphthyl group, 9,9-dimethylfluorenyl group, and monovalent residue of phenanthrene), an aromatic heterocyclic group having 5 to 50 atoms, and an alkyl group having 1 to 50 carbon atoms (e.g., methyl group, ethyl group, n-propyl group, isopropyl group, n-butyl group, sec-butyl group, and tert-butyl group).

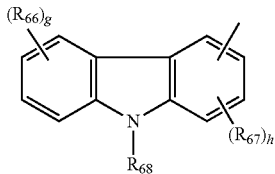

(17)

wherein $R_{66}$ and $R_{67}$ are independently a hydrogen atom, a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthridine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole, or a monovalent residue of benzimidazole), a substituted or unsubstituted alkyl group having 1 to 50 carbon atoms (e.g., methyl group, ethyl group, n-propyl group, isopropyl group, n-butyl group, sec-butyl group, or tert-butyl group), a substituted or unsubstituted cycloalkyl group (e.g., cyclopentyl group, cyclohexyl group, or cycloheptyl group), a substituted or unsubstituted alkoxy group having 1 to 50 carbon atoms (e.g., methoxy group or ethoxy group), a substituted or unsubstituted aralkyl group having 6 to 50 carbon atoms (e.g., benzyl group), a substituted or unsubstituted aryloxy group having 5 to 50 atoms (e.g., phenoxy group), a substituted or unsubstituted alkoxycarbonyl group having 1 to 50 carbon atoms (e.g., methylcarbonyl group), a substituted or unsubstituted silyl group (e.g., trialkylsilyl group (e.g., trimethylsilyl group or tert-butyldimethylsilyl group) or arylalkylsilyl group (e.g., phenyldimethylsilyl group or tert-butyldiphenylsilyl group)), a carboxyl group, a halogen atom (e.g., fluorine atom), a cyano group, a nitro group, or a hydroxy group, g is an integer from 0 to 4, h is an integer from 0 to 3, provided that a plurality of $R_{66}$ may be identical or different when g is an integer equal to or larger than 2, a plurality of $R_{67}$ may be identical or different when h is an integer equal to or larger than 2, and adjacent substituents among a plurality of $R_{66}$ and $R_{67}$ may form a fused ring (e.g., fused benzo ring or fused naphtho ring), and $R_{68}$ is a substituted or unsubstituted aromatic ring group having 6 to 50 carbon atoms (e.g., a monovalent residue of a benzene derivative, a monovalent residue of a naphthalene derivative, a monovalent residue of an anthracene derivative, a monovalent residue of a pyrene derivative, a monovalent residue of a 9,9-dimethylfluorene derivative, a monovalent residue of a phenanthrene derivative, a monovalent residue of a chrysene derivative, a monovalent residue of a benzo[a]anthracene derivative, a monovalent residue of a fluoranthene derivative, a monovalent residue of a triphenylene derivative, a monovalent residue of an acenaphthylene derivative, a monovalent residue of a picene derivative, or a monovalent residue of a perylene derivative), or a substituted or unsubstituted aromatic heterocyclic group having 5 to 50 atoms (e.g., a monovalent residue of a furan derivative, a monovalent residue of a benzofuran derivative, a monovalent residue of a dibenzofuran derivative, a monovalent residue of a thiophene derivative, a monovalent residue of a benzothiophene derivative, a monovalent residue of a dibenzothiophene derivative, a monovalent residue of a quinoline derivative, a monovalent residue of isoquinoline, a monovalent residue of quinazoline, a monovalent residue of cinnoline, a monovalent residue of quinoxaline, a monovalent residue of phthalazine, a monovalent residue of acridine, a monovalent residue of phenanthridine, a monovalent residue of xanthene, a monovalent residue of phenazine, a monovalent residue of phenothiazine, a monovalent residue of phenoxathiin, a monovalent residue of phenoxazine, a monovalent residue of thianthrene, a monovalent residue of chroman, a monovalent residue of isochroman, a monovalent residue of carbazole (a case where only a carbazol-9-yl heterocyclic structure is present is excluded), or a monovalent residue of benzimidazole (a case where only a benzimidazol-2-yl heterocyclic structure is present is excluded)), a substituted or unsubstituted alkyl group having 1 to 50 carbon atoms (e.g., methyl group, ethyl group, n-propyl group, isopropyl group, n-butyl group, sec-butyl group, or tert-butyl group), or a substituted or unsubstituted cycloalkyl group (e.g., cyclopentyl group, cyclohexyl group, or cycloheptyl group).

Examples of a substituent include an aromatic ring group having 6 to 60 carbon atoms (e.g., phenyl group, naphthyl group, biphenyl group, terphenyl group, naphthylphenyl group, phenylnaphthyl group, 9,9-dimethylfluorenyl group, and monovalent residue of phenanthrene), an aromatic heterocyclic group having 5 to 50 atoms, and an alkyl group having 1 to 50 carbon atoms (e.g., methyl group, ethyl group, n-propyl group, isopropyl group, n-butyl group, sec-butyl group, and tert-butyl group).

A compound shown by the following formula (16) is also preferable as the material for the capping layer.

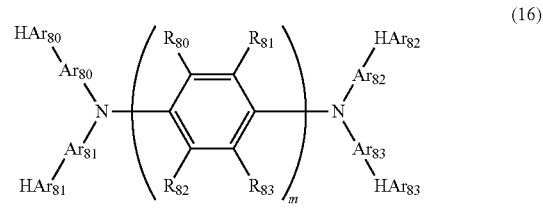

(16)

wherein m is an integer from 2 to 4 (preferably 2), $Ar_{80}$ to $Ar_{83}$ are independently a substituted or unsubstituted aromatic ring group having 6 to 50 carbon atoms (e.g., a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, or a monovalent residue, or a divalent or higher valent residue of a perylene derivative), or a substituted or unsubstituted aromatic heterocyclic group having 5 to 50 atoms (e.g., a monovalent residue, or a divalent or higher valent residue of a furan derivative, a monovalent residue, or a divalent or higher valent residue of a benzofuran derivative, a monovalent residue, or a divalent or higher valent residue of a dibenzofuran derivative, a monovalent residue, or a divalent or higher valent residue of a thiophene derivative, a monovalent residue, or a divalent or higher valent residue of a benzothiophene derivative, a monovalent residue, or a divalent or higher valent residue of a dibenzothiophene derivative, a monovalent residue, or a divalent or higher valent residue of a quinoline derivative, a monovalent residue, or a divalent or higher valent residue of isoquinoline, a monovalent residue, or a divalent or higher valent residue of quinazoline, a monovalent residue, or a divalent or higher valent residue of cinnoline, a monovalent residue, or a divalent or higher valent residue of quinoxaline, a monovalent residue, or a divalent or higher valent residue of phthalazine, a monovalent residue, or a divalent or higher valent residue of acridine, a monovalent residue, or a divalent or higher valent residue of phenanthriazine, a monovalent residue, or a divalent or higher valent residue of xanthene, a monovalent residue, or a divalent or higher valent residue of phenazine, a monovalent residue of phenothiazine, a monovalent residue, or a divalent or higher valent residue of phenoxathiin, a monovalent residue, or a divalent or higher valent residue of phenoxazine, a monovalent residue, or a divalent or higher valent residue of thianthrene, a monovalent residue, or a divalent or higher valent residue of chroman, a monovalent residue, or a divalent or higher valent residue of isochroman, a monovalent residue, or a divalent or higher valent residue of carbazole, and/or a monovalent residue, or a divalent or higher valent residue of benzimidazole), $R_{80}$ to $R_{83}$ are independently a hydrogen atom, a substituted or unsubstituted aromatic ring group having 6 to 50 carbon atoms (e.g., a monovalent residue, or a divalent or higher valent residue of a benzene derivative, a monovalent residue, or a divalent or higher valent residue of a naphthalene derivative, a monovalent residue, or a divalent or higher valent residue of an anthracene derivative, a monovalent residue, or a divalent or higher valent residue of a pyrene derivative, a monovalent residue, or a divalent or higher valent residue of a 9,9-dimethylfluorene derivative, a monovalent residue, or a divalent or higher valent residue of a phenanthrene derivative, a monovalent residue, or a divalent or higher valent residue of a chrysene derivative, a monovalent residue, or a divalent or higher valent residue of a benzo[a]anthracene derivative, a monovalent residue, or a divalent or higher valent residue of a fluoranthene derivative, a monovalent residue, or a divalent or higher valent residue of a triphenylene derivative, a monovalent residue, or a divalent or higher valent residue of an acenaphthylene derivative, a monovalent residue, or a divalent or higher valent residue of a picene derivative, or a monovalent residue, or a divalent or higher valent residue of a perylene derivative), a substituted or unsubstituted aromatic heterocyclic group having 5 to 50 atoms (e.g., a monovalent residue, or a divalent or higher valent residue of a furan derivative, a monovalent residue, or a divalent or higher valent residue of a benzofuran derivative, a monovalent residue, or a divalent or higher valent residue of a dibenzofuran derivative, a monovalent residue, or a divalent or higher valent residue of a thiophene derivative, a monovalent residue, or a divalent or higher valent residue of a benzothiophene derivative, a monovalent residue, or a divalent or higher valent residue of a dibenzothiophene derivative, a monovalent residue, or a divalent or higher valent residue of a quinoline derivative, a monovalent residue, or a divalent or higher valent residue of isoquinoline, a monovalent residue, or a divalent or higher valent residue of quinazoline, a monovalent residue, or a divalent or higher valent residue of cinnoline, a monovalent residue, or a divalent or higher valent residue of quinoxaline, a monovalent residue, or a divalent or higher valent residue of phthalazine, a monovalent residue, or a divalent or higher valent residue of acridine, a monovalent residue, or a divalent or higher valent residue of phenanthriazine, a monovalent residue, or a divalent or higher valent residue of xanthene, a monovalent residue, or a divalent or higher valent residue of phenazine, a monovalent residue, or a divalent or higher valent residue of phenothiazine, a monovalent residue, or a divalent or higher valent residue of phenoxathiin, a monovalent residue, or a divalent or higher valent residue of phenoxazine, a monovalent residue, or a divalent or higher valent residue of thianthrene, a monovalent residue, or a divalent or higher valent residue of chroman, a monovalent residue, or a divalent or higher valent residue of isochroman, a monovalent residue, or a divalent or higher valent residue of carbazole, or a monovalent residue, or a divalent or higher valent residue of benzimidazole), a substituted or unsubstituted alkyl group having 1 to 50 carbon atoms (e.g., methyl group, ethyl group, n-propyl group, isopropyl group, n-butyl group, sec-butyl group, or tert-butyl group), a substituted or unsubstituted cycloalkyl group (e.g., cyclopentyl group, cyclohexyl group, or cycloheptyl group), a substituted or unsubstituted alkoxy group having 1 to 50 carbon atoms (e.g., methoxy group or ethoxy group), a substituted or unsubstituted aralkyl group having 6 to 50 carbon atoms (e.g., benzyl group), a substituted or unsubstituted aryloxy group having 5 to 50 atoms (e.g., phenoxy group), a substituted or unsubstituted alkoxycarbonyl group having 1 to 50 carbon atoms (e.g., methylcarbonyl group), a substituted or unsubstituted silyl group (e.g., trialkylsilyl group (e.g., trimethylsilyl group or tert-butyldimethylsilyl group) or arylalkylsilyl group (e.g., phenyldimethylsilyl group or tert-butyldiphenylsilyl group)), a carboxyl group, a halogen atom (e.g., fluorine atom), a cyano group, a nitro group, or a hydroxy group, provided that adjacent substituents among $R_{80}$ to $R_{83}$ may form a fused ring (e.g., fused benzo ring or fused naphtho ring), a plurality of $R_{40}$ to $R_{43}$ may be either identical or different, and one of $R_{41}$ and one of $R_{40}$ and/or one of $R_{43}$ and one of $R_{42}$ may form a cyclic structure (e.g., fluorene structure) that may be substituted with a substituent (e.g., dimethyl group or a cyclohexylidine group), and $HAr_{80}$ to $HAr_{83}$ are independently a hydrogen atom or a substituted or unsubstituted aromatic heterocyclic group having 5 to 50 atoms (e.g., a monovalent residue, or a divalent or higher valent residue of a furan derivative, a monovalent residue, or a divalent or higher valent residue of a benzofuran derivative, a monovalent residue, or a divalent or higher valent residue of a dibenzofuran derivative, a monovalent residue, or a divalent or higher valent residue of a thiophene derivative, a monovalent residue, or a divalent or higher valent residue of a benzothiophene derivative, a monovalent residue, or a divalent or higher valent residue of a dibenzothiophene derivative, a monovalent residue, or a divalent or higher valent residue of a quinoline derivative, a monovalent residue, or a divalent or higher valent residue of isoquinoline, a monovalent residue, or a divalent or higher valent residue of quinazoline, a monovalent residue, or a divalent or higher valent residue of cinnoline, a monovalent residue, or a divalent or higher valent residue of quinoxaline, a monovalent residue, or a divalent or higher valent residue of phthalazine, a monovalent residue, or a divalent or higher valent residue of acridine, a monovalent residue, or a divalent or higher valent residue of phenanthriazine, a monovalent residue, or a divalent or higher valent residue of xanthene, a monovalent residue, or a divalent or higher valent residue of phenazine, a monovalent residue, or a divalent or higher valent residue of phenothiazine, a monovalent residue, or a divalent or higher valent residue of phenoxathiin, a monovalent residue, or a divalent or higher valent residue of phenoxazine, a monovalent residue, or a divalent or higher valent residue of thianthrene, a monovalent residue, or a divalent or higher valent residue of chroman, a monovalent residue, or a divalent or higher valent residue of isochroman, a monovalent residue, or a divalent or higher valent residue of carbazole, or a monovalent residue, or a divalent or higher valent residue of benzimidazole), provided that a case where all of $HAr_{80}$ to $HAr_{83}$ are hydrogen atoms is excluded.

Examples of a substituent include an aromatic ring group having 6 to 60 carbon atoms (e.g., phenyl group, naphthyl group, biphenyl group, terphenyl group, naphthylphenyl group, phenylnaphthyl group, 9,9-dimethylfluorenyl group, and monovalent residue of phenanthrene), an aromatic heterocyclic group having 5 to 50 atoms, and an alkyl group having 1 to 50 carbon atoms (e.g., methyl group, ethyl group, n-propyl group, isopropyl group, n-butyl group, sec-butyl group, and tert-butyl group).

The functions of the capping layer are described below in connection with a surface plasmon-mediated energy transfer phenomenon.

Surface Plasmon-Mediated Energy Transfer

When light is incident on the interface between a metal and a dielectric, the energy of light is absorbed by surface plasmons. The term "surface plasmon" refers to a combination of compression waves of free electron gas that is localized on the surface of the metal and electromagnetic waves transmitted along the direction of the interface between the metal and the dielectric. Surface plasmons may be excited due to radiation of a dipole moment present near the surface of the metal. Coupling of dipole radiation with surface plasmons appears as a quenching phenomenon due to the metal.

The energy transfer phenomenon due to dipole radiation and surface plasmons may be handled as the electromagnetic perturbation of a Lorentz oscillator (i.e., dipole moment). The effects of the perturbation due to the reflected field strongly depend on the orientation of the dipole moment and the boundary conditions for the electric field and the magnetic field, and appear as a change in emission properties (e.g., radiation anisotropy and excitation lifetime). The above electromagnetic theory and experiments have revealed that surface plasmons are directly excited due to evanescent light emitted from a dipole present near the surface of a metal. This phenomenon significantly affects the emission properties of an organic EL device that has a metal-dielectric multilayer film structure. The effects of surface plasmons significantly appear as a change in emission properties when the distance between the emitting molecules and the metal electrode is short, and the emitting molecules are provided between the metal electrodes (e.g., resonator).

The study of the surface plasmon-mediated energy transfer conducted by Barnes et al. (JP-T-2005-535121) suggests that the quenching phenomenon due to a metal significantly affects the organic EL emission properties. An emitting device that utilizes a metal electrode necessarily deteriorates in luminous efficiency due to the surface plasmon-mediated energy transfer. It is necessary to suppress the surface plasmon-mediated energy transfer, or emit the energy absorbed by surface plasmons in order to obtain a high luminous efficiency. Note that the study conducted by Barnes et al. is a mere basic verification using optical excitation, and does not control the design and the EL emission properties (e.g., chromaticity) of an organic EL device.

Since the emission properties of an organic EL device in the front direction are most important, it is necessary to take account of a change in dipole radiation anisotropy due to the capping layer. The luminous intensity and the chromaticity in the front direction change due to quenching caused by surface plasmons and dipole radiation anisotropy.

Method that Suppresses Quenching Due to Surface Plasmon-Mediated Energy Transfer The effects of the surface plasmon-mediated energy transfer and a change in dipole radiation anisotropy on the luminous efficiency of a top-emission EL device were analyzed in detail. As a result, it was found that it is possible to suppress coupling of the dipole radiation energy with the surface plasmon mode, and implement an improvement in luminous efficiency and an adjustment of the chromaticity of the top-emission EL device by providing the capping layer on the upper semitransparent metal electrode.

Figure 2:
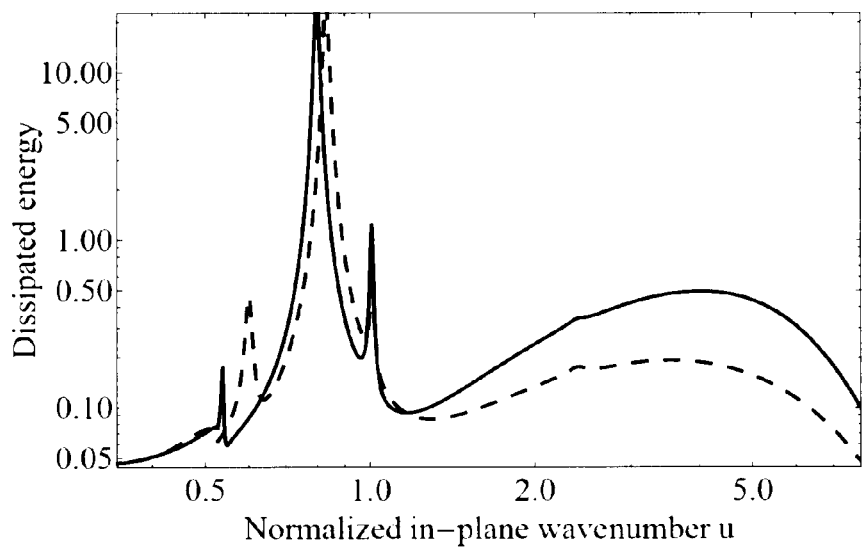
FIG. 2 is a view showing wavenumber expansion of dipole radiation energy.

FIG. 2 is a graph (wavenumber expansion) of the dipole radiation energy (photonic mode density (PMD) (wavenumber expansion of dipole radiation energy mode)). In FIG. 2, the solid line indicates the case where the capping layer is not provided, and the broken line the case where the capping layer is provided. The graph shown in FIG. 2 is drawn on the assumption that the orientation of the dipole moment is parallel to the surface of the substrate. The peak of the surface plasmon coupling mode that appears at a normalized wavenumber u of 3 to 10 changes to a large extent when the thickness of the capping layer is increased to 50 nm from 0 nm. The surface plasmon coupling mode is a special surface plasmon mode that appears when a metal layer is present on each side of the upper/lower electrode (i.e., a special oscillation mode in which excited surface plasmons are coupled to the upper/lower metal layer). The probability that photons emitted from the dopant within the emitting layer have a wavenumber as propagated light instead of evanescent light must be a value obtained by normalizing the area of the PMD at a normalized wavenumber u of 0 to 1.0 using the total area (from the normalized wavenumber 0 to a value integrated to infinity). Therefore, the probability that photons are emitted from the dopant as propagated light increases as the area of the surface plasmon coupling mode that appears in the evanescent region decreases. Specifically, since the efficiency of energy transfer to the surface plasmon coupling mode decreases as a result of disposing the capping layer on the upper electrode, the luminous efficiency is improved.

Figure 3:
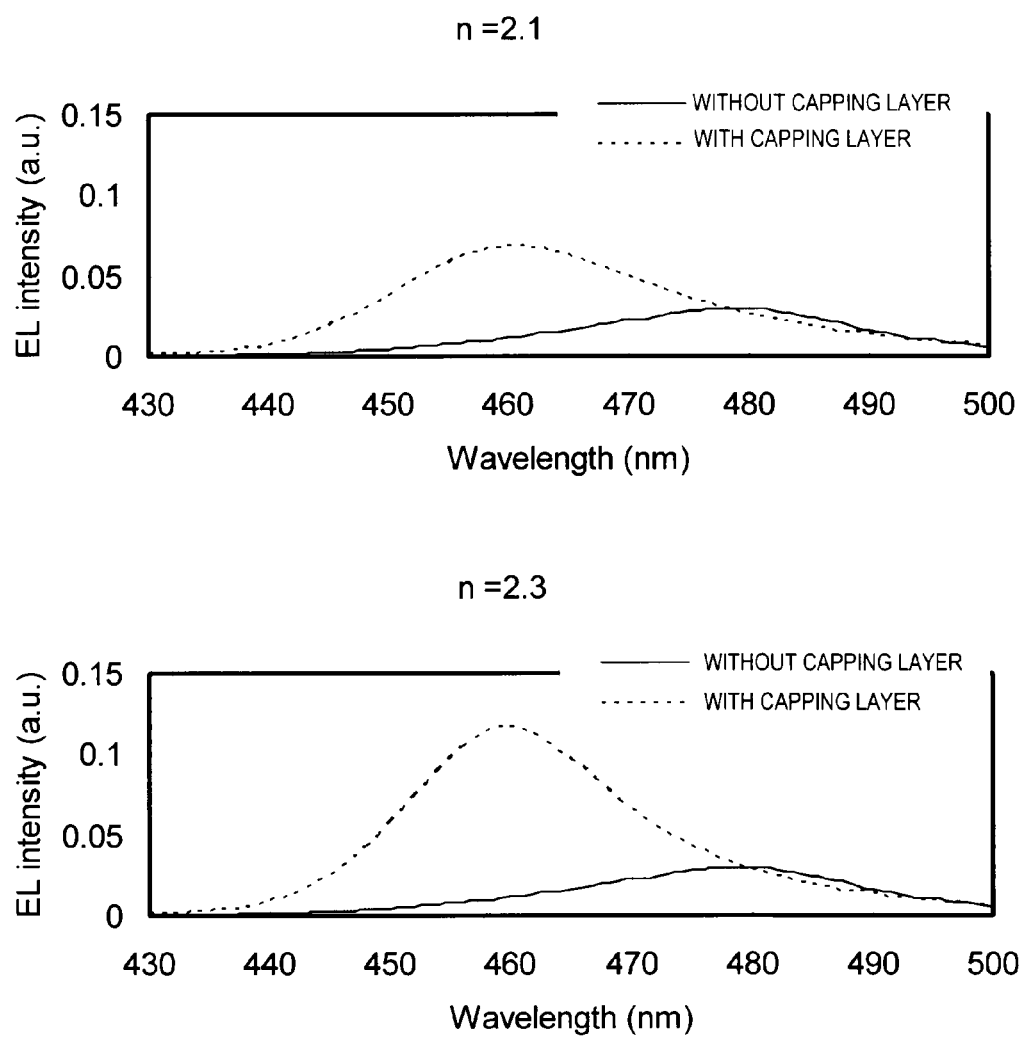
FIG. 3 shows EL spectrum simulation results for a case where a capping layer is provided and a case where a capping layer is not provided.

FIG. 3 shows the simulation results for the emission properties of the top-emission organic EL device when the refractive index is 2.1 or 2.3 on the assumption that the capping layer does not have a refractive index dispersion. The thickness of the capping layer was 40 nm. As is clear from the shape of the simulated emission spectrum, the emission peak increased when using the material having a refractive index of 2.3 as the material for the capping layer. It was thus found that the outcoupling efficiency of light having a wavelength shorter than the peak wavelength of the emission spectrum can be selectively improved by utilizing a material that exhibits a significant normal refractive index dispersion and does not have absorption in the blue emission region. Specifically, a sharp emission spectrum (wavelength) can be achieved without providing a resonator structure between the electrodes by utilizing the capping layer that exhibits a normal refractive index dispersion in the blue emission region. Therefore, the CIEy value can be decreased, and blue light that exhibits excellent chromaticity can be obtained. It is unnecessary to adjust the carrier balance since a sharp emission spectrum (wavelength) can be achieved without providing a resonator structure. The carrier balance of the device between the electrodes changes when controlling the thickness using a resonator structure. This causes the recombination region of electron and holes to change, so that the internal quantum efficiency decreases as compared with an optimized device, and a decrease in lifetime of the device and an increase in voltage occur. Therefore, it is very difficult to optimize the carrier balance that significantly affects the performance of the device and optimize the optical balance.

When using the capping layer that exhibits a normal refractive index dispersion, the optical length of the capping layer significantly increases as compared with that on the long wavelength side as the wavelength becomes shorter. The optical length of the capping layer is defined by the expression "refractive index×thickness÷wavelength". Since the surface plasmon energy-wavenumber dispersion relationship changes when the optical length of the capping layer increases, the coupling efficiency of photons emitted on the short wavelength side with surface plasmons decreases as compared with that on the long wavelength side. As a result, the emission spectrum in the front direction is modified so that emission on the short wavelength side is enhanced due to the above factor and a change in dipole radiation anisotropy. This makes it possible to decrease the CIEy value, so that a top-emission organic EL device that has a small CIEy value while exhibiting a high efficiency or maintaining the efficiency can be implemented.

The method that optimizes the energy transfer phenomenon due to dipole radiation of excited molecules and surface plasmons between electrodes and a change in dipole radiation anisotropy completely differs from the design based on optimization of the optical interference distance (e.g., resonator) (Patent Documents 1 to 4). It is important to optimize the optical interference distance and dipole radiation anisotropy, and decrease the efficiency of quenching due to the surface plasmon-mediated energy transfer in order to improve the organic EL luminous efficiency and adjust the chromaticity at the same time.

As a result of optical simulation based on the optical interference theory taking account of dipole radiation anisotropy and the wavelength dependence of the efficiency of surface plasmon-mediated energy transfer, and analysis of the actual device, a device that has a small CIEy value of 0.06 or less in the blue-emitting region, and exhibits highly efficient emission properties was implemented.

In particular, it was found that the outcoupling efficiency of blue light at a wavelength of 430 to 460 nm is improved due to the effect of suppressing coupling of the dipole radiation energy with the surface plasmon mode when the amount of change in refractive index at a wavelength of 430 to 460 nm is 0.08 or more, so that the purity of blue emission in the emission spectrum is significantly improved.

Even when using a material that satisfies the above conditions and has a peak of the wavelength dispersion of the refractive index at a wavelength of 430 to 460 nm, the outcoupling efficiency of blue light at a wavelength of 430 to 460 nm is improved if the material has an extinction coefficient of 0.1 or less. Therefore, the purity of blue emission can be improved.

A material for which the effective refractive index is changed by dispersing a dye or nanoparticles in an acrylic matrix (e.g., PMMA) may be used as the material for the capping layer by selecting an appropriate absorption peak wavelength.

It is also preferable to use a material for which the emission spectrum and absorption spectrum have a positional relationship that corresponds to the Stokes shift (e.g., host material and dopant molecule).

(2) First Electrode

A metal (e.g., Ag, Al, or Au) or a metal alloy (e.g., Ag—Pd—Cu (APC)) is preferable as a material for the first electrode. The first electrode may be formed by stacking such a metal or a metal alloy. A transparent electrode layer (e.g., indium tin oxide (ITO) or indium zinc oxide) may be formed on the upper side and/or the lower side of a metal/metal alloy layer or a metal/metal alloy stacked layer.

(3) Second Electrode

The second electrode may be formed using a metallic material. The term "metallic material" used herein refers to a material that has a negative value as the real part of the dielectric constant. Examples of the metallic material include a metal and an organic/inorganic transparent electrode material other than a metal that exhibits metallic luster. It is expected that surface plasmons are excited when forming the second electrode using such a material.

Examples of a preferable metal include Ag, Mg, Al, Ca, alloys thereof, and the like. It is preferable that the second electrode be semitransparent and have a transmittance in the front direction of 20% or more in order to outcouple light in the front direction of the device while utilizing a resonator. When forming the second electrode using Ag, Mg, Al, Ca, or an alloy thereof, it is preferable that the second electrode have a thickness of 30 nm or less so that the second electrode sufficiently allows light to pass through.

(4) Organic Layer

The organic layer according to the invention has a multi-layer film structure (i.e., anode/first organic layer/emitting layer/second organic layer/cathode). Specific examples of the multilayer film structure include an anode/hole-transporting region/emitting layer/electron-transporting region/cathode.

The hole-transporting region may include a hole-injecting layer or a hole-transporting layer, or may be formed by stacking a plurality of such layers. The electron-transporting region may include an electron-injecting layer or an electron-transporting layer, or may be formed by stacking a plurality of such layers.

The emitting layer normally includes a host material and a dopant material.

A fused aromatic ring derivative is preferable as the host material. An anthracene derivative, a pyrene derivative, or the like is more preferable as the fused aromatic ring derivative from the viewpoint of the luminous efficiency and the lifetime.

The dopant material is not particularly limited as long as the dopant material functions as a dopant, but is preferably an aromatic amine derivative from the viewpoint of the luminous efficiency and the like. A fused aromatic ring derivative that includes a substituted or unsubstituted arylamino group is preferable as the aromatic amine derivative. Examples of such a compound include pyrene, anthracene, and chrysene that include an arylamino group.

A styrylamine compound is also preferable as the dopant material. Examples of the styrylamine compound include styrylamines, styryldiamines, styryltriamines, and styryltetramines. The term "styrylamine" used herein refers to a compound in which a substituted or unsubstituted arylamine is substituted with at least one arylvinyl group. The arylvinyl group may be substituted with a substituent. Examples of the substituent include an aryl group, a silyl group, an alkyl group, a cycloalkyl group, and an arylamino group. The substituent may be substituted with another substituent.

A boron complex or a fluoranthene compound is also preferable as the dopant material. A metal complex is also preferable as the dopant material. Examples of the metal complex include an iridium complex and a platinum complex.

The peak wavelength of the photoluminescence (PL) spectrum of the dopant material (i.e., emitting material) is preferably 430 to 500 nm. The PL spectrum may be obtained by dispersing the dopant material in toluene at a concentration of several μmol/liter, and applying UV light to the solution to measure the emission spectrum distribution of the dopant material. Alternatively, the PL spectrum may be obtained by depositing the dopant material on a glass substrate by vacuum deposition to a thickness of several tens to about 100 nm to obtain a sample, and exciting the sample by applying UV light to measure the emission spectrum distribution of the dopant material.

A material for forming the hole-injecting layer or the hole-transporting layer is not particularly limited. A known material used for the hole-injecting layer or the hole-transporting layer of an organic EL device may be used. A material for forming the hole-injecting layer or the hole-transporting layer is preferably a compound that transports holes, exhibits an excellent hole-injecting effect (from the anode layer to the emitting layer or the emitting material), prevents movement of excitons generated in the emitting layer to the electron-injecting layer or the electron-injecting material, and exhibits an excellent thin film-forming capability. Examples of the material for forming the hole-injecting layer or the hole-transporting layer include, but are not limited to, phthalocyanine derivatives, naphthalocyanine derivatives, porphyrin derivatives, oxazole, oxadiazole, triazole, imidazole, imidazolone, imidazolethione, pyrazoline, pyrazolone, tetrahydroimidazole, oxazole, oxadiazole, hydrazone, acylhydrazone, polyarylalkanes, stilbene, butadiene, derivatives thereof, amine derivatives such as benzidine-type triphenylamines, styrylamine-type triphenylamines, and diamine-type triphenylamines, polymer materials such as polyvinylcarbazoles, polysilanes, and conductive polymers, and the like.

Specific examples of a preferable material for forming the electron-transporting layer and the electron-injecting layer include a metal complex of 8-hydroxyquinoline or a derivative thereof, oxadiazole derivatives, and nitrogen-containing heterocyclic derivatives. Specific examples of a metal complex of 8-hydroxyquinoline or a derivative thereof include metal chelate oxinoid compounds that include a chelate of oxine (8-quinolinol or 8-hydroxyquinoline) (e.g., tris(8-quinolinol)aluminum).

The electron-injecting layer may be formed using an alkali metal compound or a material obtained by adding a donor (e.g., alkali metal) to the material for forming the electron-transporting layer.

The donor may be at least one substance selected from the group consisting of donor metals, donor metal compounds, and donor metal complexes.

Examples of a preferable alkali metal compound include halides and oxides of alkali metals. An alkali metal fluoride is more preferable as the alkali metal compound. For example, LiF is preferably used.

The term "donor metal" used herein refers to a metal having a work function of 3.8 eV or less. The donor metal is preferably an alkali metal, an alkaline-earth metal, or a rare earth metal, and more preferably Cs, Li, Na, Sr, K, Mg, Ca, Ba, Yb, Eu, or Ce.

The term "donor metal compound" used herein refers to a compound that includes a donor metal. The donor metal compound is preferably a compound that includes an alkali metal, an alkaline-earth metal, or a rare earth metal, and more preferably a halide, an oxide, a carbonate, or a borate of these metals. For example, the donor metal compound is a compound shown by MOx (wherein M is a donor metal, and x is a number from 0.5 to 1.5), MFx (x is a number from 1 to 3), or $M(CO_3)x$ (x is a number from 0.5 to 1.5).

The term "donor metal complex" used herein refers to a complex of a donor metal. The donor metal complex is preferably an organic complex of an alkali metal, an alkaline-earth metal, or a rare earth metal.

The length of the resonator is normally adjusted by adjusting the thickness of the organic layer(s) including the emitting layer in order to improve the luminous efficiency.

In the top-emission organic EL device according to the first embodiment, the length of the resonator is defined by the second electrode, the organic layers including the emitting layer, and the first electrode. When the emitting layer is a blue-emitting layer, the length of the resonator is adjusted so that the peak wavelength (i.e., a wavelength at which luminous intensity is a maximum) is 430 to 480 nm in a state in which the capping layer is not provided.

A method of fabricating the organic EL device is described below.

The lower electrode is formed on a glass substrate (device substrate) by sputtering or the like. The organic layers including the emitting layer are formed on the lower electrode by vacuum deposition or the like. LiF is then deposited as the electron-injecting layer, and the semitransparent upper electrode is formed by vacuum deposition or the like. The capping layer is formed on the upper electrode by vacuum deposition or the like to obtain an organic EL device.

Second Embodiment

Figure 4:
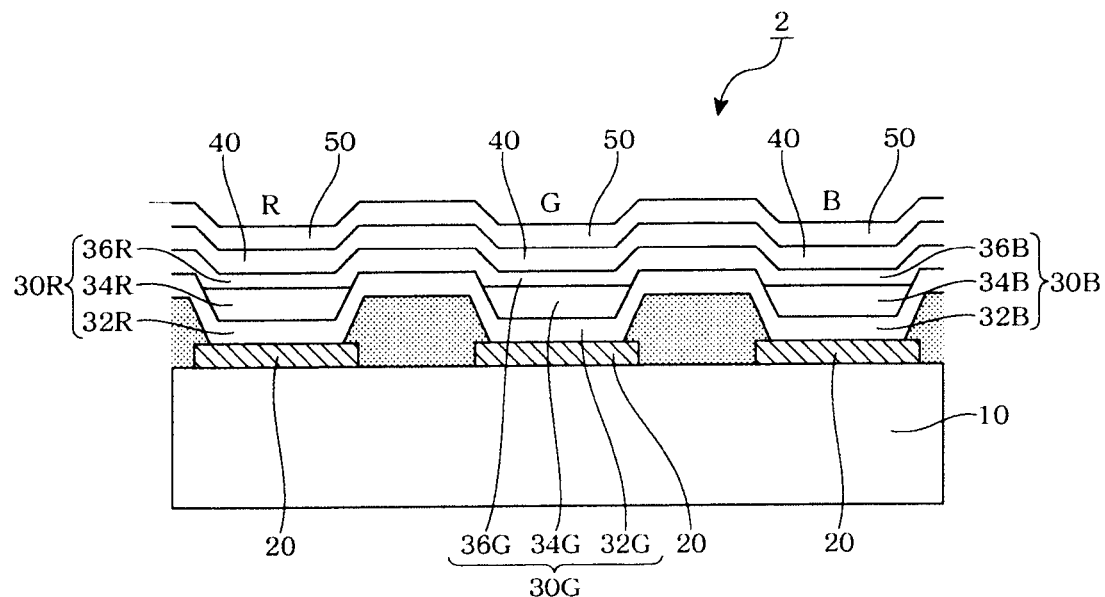
FIG. 4 is a view showing an organic EL device according to a second embodiment of the invention.

FIG. 4 is a schematic view showing an organic EL device according to a second embodiment of the invention. In FIG. 4, the same members as those shown in FIG. 1 are indicated by identical reference symbols (numerals). Description of these members is omitted. In a top-emission organic EL device 2 shown in FIG. 4, a blue pixel B, a green pixel G, and a red pixel R are arranged in parallel on a common substrate 10.

The blue pixel B is configured in the same manner as the organic EL device 1 according to the first embodiment.

The green pixel G sequentially includes a substrate 10, a first electrode 20, an organic layer 30G that includes a first organic layer 32G, a green-emitting layer 34G, and a second organic layer 36G, a second electrode 40, and a capping layer 50.

The red pixel R sequentially includes a substrate 10, a first electrode 20, an organic layer 30R that includes a first organic layer 32R, a red-emitting layer 34R, and a second organic layer 36R, a second electrode 40, and a capping layer 50.

The capping layer 50 is provided common to the blue pixel B, the green pixel G, and the red pixel R. Light is outcoupled (emitted) through the capping layer 50. The capping layer 50 has a refractive index and an extinction coefficient that are optimized for blue light, as described above in connection with the first embodiment.

It is preferable that a material for forming the capping layer used for the organic EL device according to the second embodiment have no absorption in a visible region at a wavelength of 430 to 780 nm in order to efficiently outcouple (obtain) light from the blue pixel B, the green pixel G, and the red pixel R. Specifically, it is preferable that the extinction coefficient of the capping layer be 0.1 or less at a wavelength of 430 to 780 nm.

It is preferable that the material for forming the capping layer have no absorption in a visible region at a wavelength of 430 to 780 nm, and change in refractive index to a large extent in a blue emission region at a wavelength of 430 to 460 nm while exhibiting normal dispersion. It is preferable to use a material that has the absorption edge at a wavelength of 430 nm or less so that the above requirements are satisfied.

The organic layers 30B, 30G, and 30R are not limited to the configuration shown in FIG. 4. The configuration of the organic layers 30B, 30G, and 30R may be appropriately changed. The first electrode, the first organic layer, the second organic layer, and the second electrode may or may not be provided common to the blue pixel B, the green pixel G, and the red pixel R. The first organic layer and the second organic layer normally have a configuration suitable for the emission color.

It is preferable that the green-emitting layer include a host material and a dopant material described below. A fused aromatic ring derivative is preferable as the host material. An anthracene derivative, a pyrene derivative, or the like is preferable as the fused aromatic ring derivative from the viewpoint of the luminous efficiency and the lifetime.

A heteroring-containing compound may also be used as the host material. Examples of the heteroring-containing compound include carbazole derivatives, dibenzofuran derivatives, ladder-type furan compounds, and pyrimidine derivatives.

The dopant material is not particularly limited as long as the dopant material functions as a dopant, but is preferably an aromatic amine derivative from the viewpoint of the luminous efficiency and the like. A fused aromatic ring derivative that includes a substituted or unsubstituted arylamino group is preferable as the aromatic amine derivative. Examples of such a compound include pyrene, anthracene, and chrysene that include an arylamino group.

A styrylamine compound is also preferable as the dopant material. Examples of the styrylamine compound include styrylamines, styryldiamines, styryltriamines, and styryltetramines. The term "styrylamine" used herein refers to a compound in which a substituted or unsubstituted arylamine is substituted with at least one arylvinyl group. The arylvinyl group may be substituted with a substituent. Examples of the substituent include an aryl group, a silyl group, an alkyl group, a cycloalkyl group, and an arylamino group. The substituent may be substituted with another substituent.

A boron complex or a fluoranthene compound is also preferable as the dopant material. A metal complex is also preferable as the dopant material. Examples of the metal complex include an iridium complex and a platinum complex.

Note that the term "green-emitting layer" used herein refers to an emitting layer that includes an emitting dopant having a peak wavelength of 500 to 570 nm.

It is preferable that the red-emitting layer include a host material and a dopant material described below. A fused aromatic ring derivative is preferable as the host material. A naphthacene derivative, a pentacene derivative, or the like is preferable as the fused aromatic ring derivative from the viewpoint of the luminous efficiency and the lifetime.

A fused polycyclic aromatic compound may also be used as the host material. Examples of the fused polycyclic aromatic compound include naphthalene compounds, phenanthrene compounds, and fluoranthene compounds.

An aromatic amine derivative is preferable as the dopant material. A fused aromatic ring derivative that includes a substituted or unsubstituted arylamino group is preferable as the aromatic amine derivative. Examples of such a compound include periflanthene which includes an arylamino group.

A metal complex is also preferable as the dopant material. Examples of the metal complex include an iridium complex and a platinum complex.

Note that the term "red-emitting layer" used herein refers to an emitting layer that includes an emitting dopant having a peak wavelength of 500 to 570 nm.

A material for forming a hole-injecting layer/hole-transporting layer included in the first organic layer is preferably selected from the materials mentioned above in connection with the first embodiment.

A material for forming an electron-injecting layer/electron-transporting layer included in the second organic layer is preferably selected from the materials mentioned above in connection with the first embodiment.

The organic EL device according to the second embodiment is fabricated as described below.

An Ag—Pd—Cu (APC) layer (silver alloy layer) (reflecting layer) and a transparent conductive layer (e.g., zinc oxide (IZO) film or tin oxide film) are sequentially formed on a substrate. The conductive material layer is patterned (etched) by lithographic technology using a resist pattern as a mask to form a lower electrode (anode). An insulating film is formed on the lower electrode by spin-coating a photosensitive resin (e.g., polyimide). The insulating film is then exposed, developed, and cured to expose the lower electrode. A blue-emitting region, a green-emitting region, and a red-emitting region are thus patterned.

A red pixel electrode, a green pixel electrode, and a blue pixel electrode are provided as the lower electrode. The red pixel electrode, the green pixel electrode, and the blue pixel electrode respectively correspond to the blue-emitting region, the green-emitting region, and the red-emitting region. The substrate is cleaned for 5 minutes using isopropyl alcohol, and then subjected to UV ozone cleaning for 30 minutes. A hole-injecting layer is stacked over the entire surface of the substrate, and a hole-transporting layer is stacked on the hole-injecting layer. Emitting layers are formed corresponding to the positions of the red pixel anode, the green pixel anode, and the blue pixel anode. When using vacuum vapor deposition, the blue-emitting layer, the green-emitting layer, and the red-emitting layer are finely patterned using a shadow mask.

An electron-transporting layer is then stacked over the entire surface of the substrate. An electron-injecting layer is then stacked over the entire surface of the substrate. Mg and Ag are then deposited to form a semitransparent upper electrode (cathode) formed of an Mg—Ag alloy. The capping layer is formed over the entire surface of the upper electrode to obtain an organic EL device.

The common capping layer makes it possible to decrease the CIEy value of the blue pixel and improve the luminous efficiency of the blue pixel. The luminous efficiency of the green pixel and the red pixel can also be improved by adjusting the optical thickness of the green pixel and the red pixel corresponding to the emission color.

Moreover, the capping layer that is common to the blue pixel, the green pixel, and the red pixel can be formed by a single process.

EXAMPLES

The structural formula of each material used to form the capping layer in Examples 1 to 4 and Comparative Examples 1 and 2 is shown below.

TABLE 1

Table 1 Wavelength dispersion of refractive index

| Wavelength (nm) | CA1 | CA2 | CA3 | CA4 | CA5 | Alq3 |
|---|---|---|---|---|---|---|
| 430 | 2.00 | 2.12 | 2.02 | 2.26 | 2.38 | 1.86 |
| 460 | 1.92 | 1.99 | 1.94 | 2.07 | 2.48 | 1.81 |
| 480 | 1.89 | 1.94 | 1.91 | 2.01 | 2.30 | 1.78 |
| 500 | 1.87 | 1.91 | 1.91 | 1.96 | 2.16 | 1.75 |
| $n(\lambda = 430) - n(\lambda = 460)$ | 0.08 | 0.13 | 0.08 | 0.19 | −0.10 | 0.05 |

(n, k) and Δn are rounded to the second decimal place.

(1) Measurement of Refractive Index, Extinction Coefficient, and Thickness

The measurement target material was deposited on a glass substrate or a silicon substrate by vacuum deposition to a thickness of about 100 nm, and the reflection/transmission/

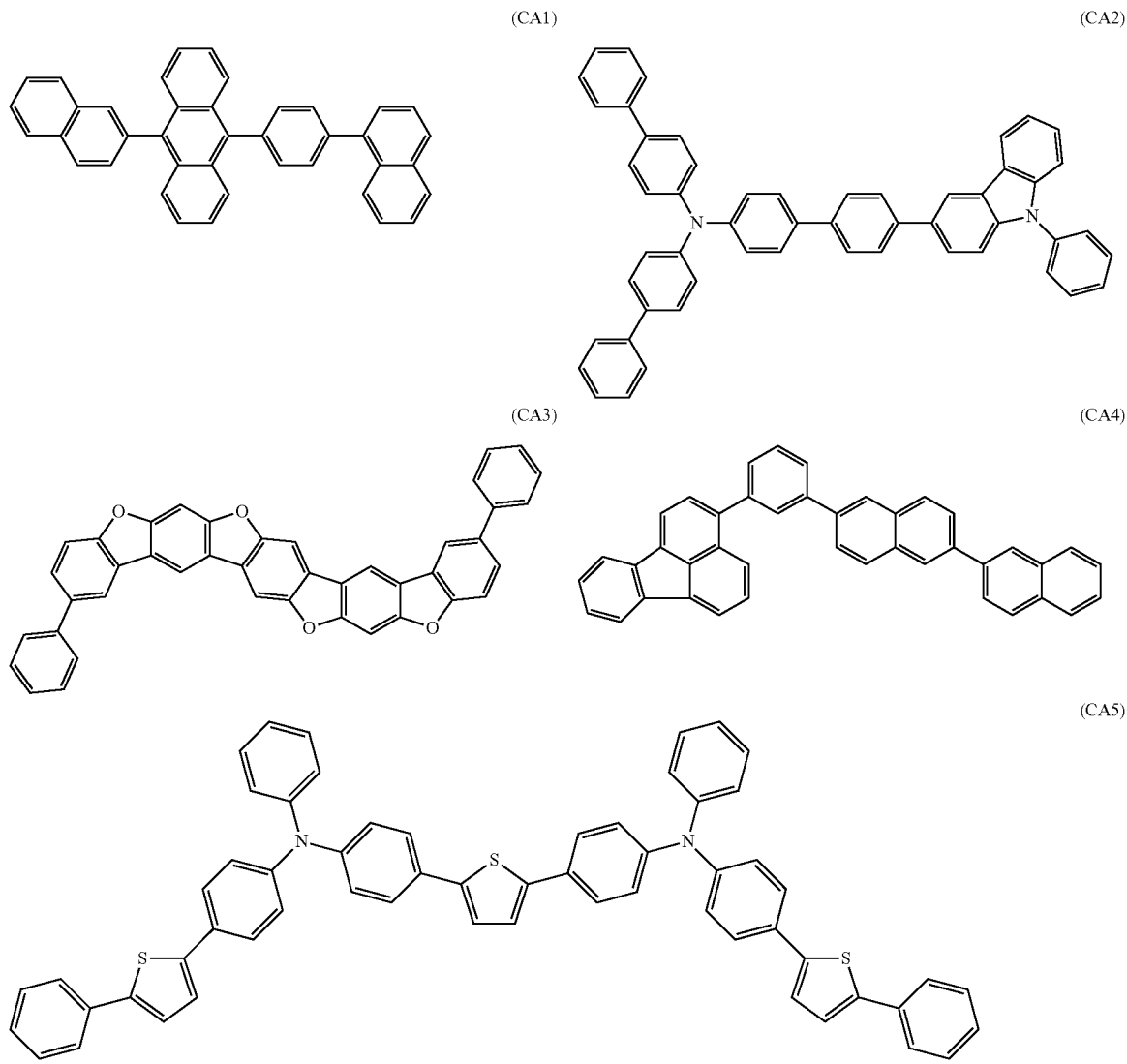

Figure 5A:
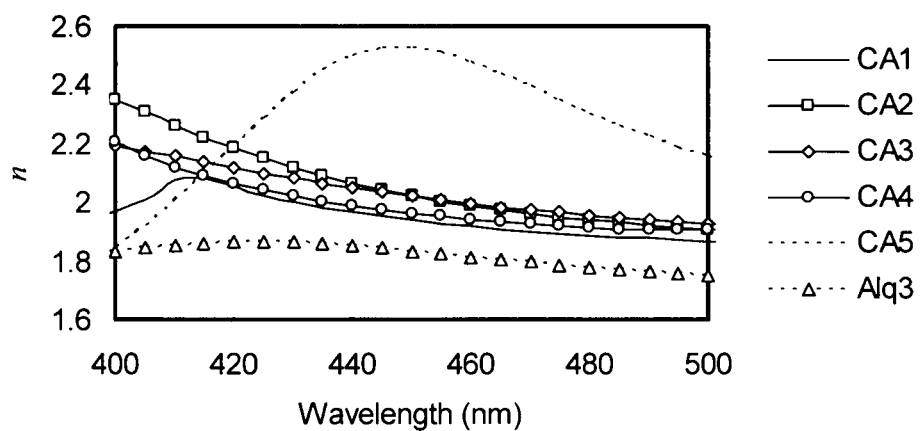
FIG. 5A is a view showing the wavelength dispersion of the refractive index of each material used in the examples and comparative examples.
Figure 5B:
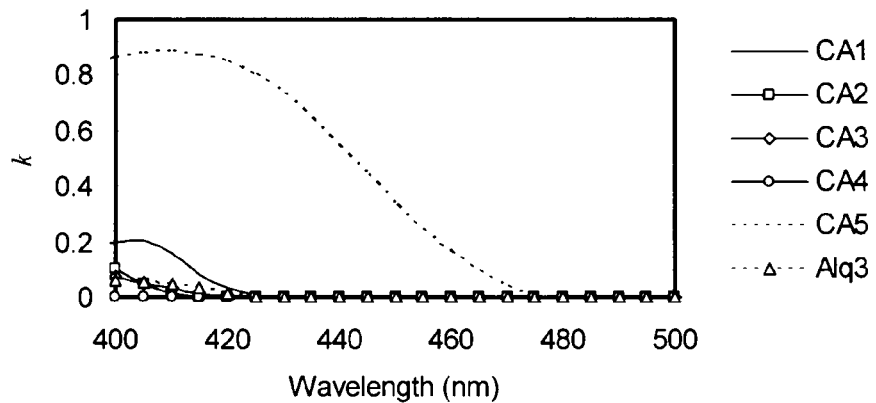
FIG. 5B is a view showing the extinction coefficient wavelength dispersion of each material used in the examples and comparative examples.

FIG. 5A and Table 1 show the wavelength dispersion of the refractive index (n) of each material (CA1 to CA5 and Alq3) used to form the capping layer in Examples 1 to 4 and Comparative Examples 1 and 2, and FIG. 5B shows the wavelength dispersion of the extinction coefficient (k) of each material.

absorption spectrum in the direction normal to the substrate was measured using a UV-visible spectroscope ("FilmTek" manufactured by Scientific Computing International). A white light source (e.g., halogen lamp or deuterium lamp) was used as the light source. The resulting spectrum was fitted by the least-square method or the like using the Lorenz model, the Drude model, an appropriate dielectric function overlapping method, or the like to calculate the refractive index, the extinction coefficient, and the thickness of the organic thin film formed on the substrate. The reflection/transmission/absorption spectrum was fitted over the entire visible region (wavelength: 380 to 780 nm) to calculate the refractive index and the extinction coefficient. The refractive index and the extinction coefficient were calculated so that the root mean square of an error between the shape of the reflection/transmission/absorption spectrum measured by the experiment and a theoretical curve of the reflection/transmission/absorption spectrum determined from the refractive index, the extinction coefficient, and the thickness was within 2%.

The refractive index and the extinction coefficient were calculated with weighting so that the root mean square of the error was minimized for a blue emission region (wavelength: 430 to 500 nm).

The transmittance of the semitransparent metal electrode was measured as described below. The measurement target material was deposited on a glass substrate by vacuum deposition to a thickness of about 10 nm, and the transmittance in the direction normal to the substrate was measured using a UV-visible spectroscope ("FilmTek" manufactured by Scientific Computing International).

The transmittance of the second electrode is preferably 10 to 80%, and more preferably 10 to 60% at a wavelength of 465 nm (blue), 530 nm (green), and 630 nm (red).

(2) Measurement of Current-Voltage-Luminance Properties

A current was caused to flow through the device at a current density of 10 mA/cm$^2$, and the current-voltage-luminance properties of EL emission in the direction normal to the surface of the device were measured using a spectroradiometer ("CS-1000" manufactured by Konica Minolta) to determine the emission spectrum and the CIE chromaticity.

Example 1

A zinc oxide (IZO) film (thickness: 10 nm), an Ag—Pd—Cu (APC) layer (silver alloy layer) (reflecting layer) (thickness: 100 nm), and a zinc oxide (IZO) film (thickness: 10 nm) were sequentially formed on a glass substrate (device substrate) by sputtering. The conductive material layer was patterned (etched) by lithography technology using a resist pattern as a mask to form a lower electrode (anode). The glass substrate on which the lower electrode was formed was subjected to ultrasonic cleaning for 5 minutes in isopropyl alcohol, and then subjected to UV ozone cleaning for 30 minutes. A material HI was deposited on the lower electrode by vacuum deposition to a thickness of 110 nm to form a hole-injecting layer. A material HT1 was deposited on the hole-injecting layer to a thickness of 20 nm to form a hole-transporting layer. Materials BH and BD (weight ratio: 93:7) were deposited on the hole-transporting layer to a thickness of 20 nm to form a blue-emitting layer. A material ET was deposited on the blue-emitting layer to a thickness of 30 nm to form an electron-transporting layer. LiF was deposited on the electron-transporting layer to a thickness of 1 nm to form an electron-injecting layer. Mg and Ag (thickness ratio: 9:1) were deposited on the electron-injecting layer to a thickness of 10 nm to form a semitransparent upper electrode (cathode) formed of an Mg—Ag alloy. A capping layer was formed over the entire surface of the upper electrode using the material CA1 to obtain an organic EL device.

Figure 6:
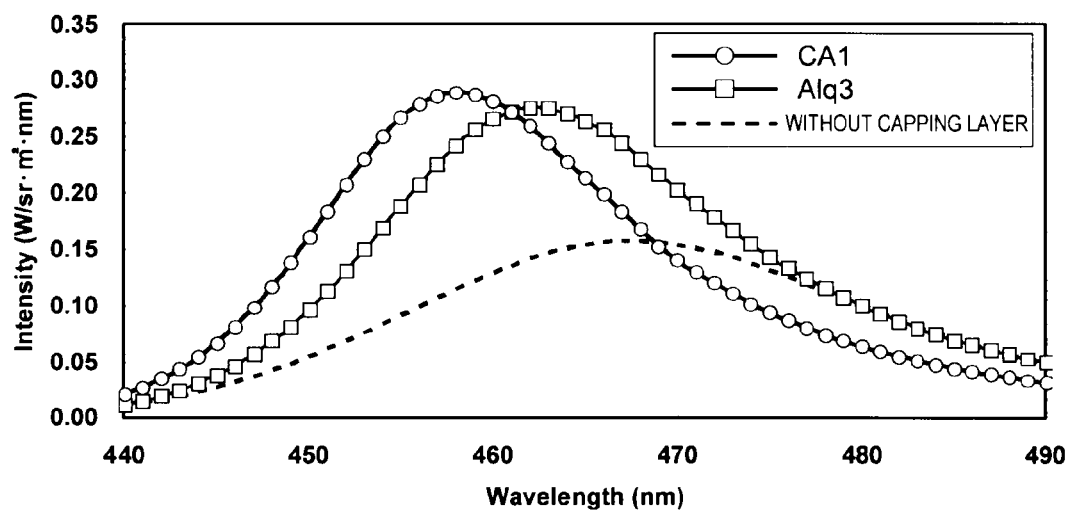
FIG. 6 is a view showing the EL spectrum measurement results obtained in Example 1 and Comparative Example 1.

The materials used in the examples are shown below.
HI: N,N-bis(4-biphenyl)-N'-phenyl-N'-[4-(5-phenylthiophen-2-yl)phenyl]-4,4'-benzidine
HT1: 3-[4'-[N,N-bis(4-biphenyl)amino]-(1,1'-biphenyl-4-yl)]-9-phenylcarbazole
HT2: N,N-bis[4-(dibenzofuran-4-yl)phenyl]-N-(1,1':4',1''-terphenyl-4-yl)amine
BH: 9-(2-naphthyl)-10-[4-(1-naphthyl)phenyl]anthracene
BD: N,N'-bis(4-isopropylphenyl)-N,N'-di-p-tolylchrysene-6,12-diamine
ET: 1-[4-[10-(naphthalen-2-yl)anthracen-9-yl]phenyl]-2-phenyl-1H-benzimidazole Table 2 and FIG. 6 show the results for the device in which the capping layer was not formed (upper part), and the device in which the capping layer was formed and the CIEy value was minimized by optimizing the film thickness (lower part). In FIG. 6, the dotted line indicates the EL spectrum of the device in which the capping layer was not formed, and the solid line indicates the EL spectrum of the device in which the capping layer was formed and the CIEy value was minimized.

Comparative Example 1

An organic EL device was fabricated and evaluated in the same manner as in Example 1, except that the capping layer was formed using Alq3. Table 2 and FIG. 6 show the results for the device in which the capping layer was not formed, and the device in which the capping layer was formed and the CIEy value was minimized by optimizing the film thickness.

Note that $\Delta y$=CIEy value (when the capping layer was not formed)−CIEy value (when the capping layer was formed), and $\Delta n = n(\lambda=430\ nm) - n(\lambda=460\ nm)$.

TABLE 2

| | | \multicolumn{3}{c}{CIE1931 color coordinates} | Peak wavelength | Peak intensity | (n, k) | (n, k) | |
|---|---|---|---|---|---|---|---|---|---|
| | | x | y | $\Delta y$ | $\lambda_p$ (nm) | $I(\lambda_p)$ | ($\lambda$ = 430 nm) | ($\lambda$ = 460 nm) | $\Delta n$ |
| Example 1 | CA1 | 0.127 | 0.08 | 0.028 | 467 | 0.16 | (2.00, 0.0) | (1.92, 0.0) | 0.08 |
| | | 0.139 | 0.052 | | 458 | 0.29 | | | |
| Com. Ex. 1 | Alq3 | 0.117 | 0.08 | 0.01 | 468 | 0.16 | (1.86, 0.0) | (1.81, 0.0) | 0.05 |
| | | 0.133 | 0.07 | | 462 | 0.28 | | | |

$I(\lambda_p)$, (n, k), and $\Delta n$ are rounded to the second decimal place.

As is clear from the results for Example 1 and Comparative Example 1, it was confirmed that a significant decrease in CIEy value (0.06 or less) was achieved when using the material satisfying the expression "$\Delta n > 0.08$" as the material for the capping layer.

As is clear from the shape of the spectrum shown in FIG. 6, the peak wavelength could be shifted to the short wavelength side in Example 1 while improving the peak intensity as compared with the case where the capping layer was not used.

As is clear from the results shown in Table 2, a significant decrease in CIEy value was achieved.

In Example 1, the peak wavelength could be shifted to the short wavelength side while maintaining the peak intensity equal to or higher than that of Comparative Example 1.

(Amount of Change in CIEy Value)

The CIEy value achieved in Example 1 (CA1) was 0.052, and the CIEy value achieved in Comparative Example 1 (Alq) was 0.07. The difference in the amount of change Δy in CIEy value between Example 1 and Comparative Example 1 was more than double.

Figure 11:
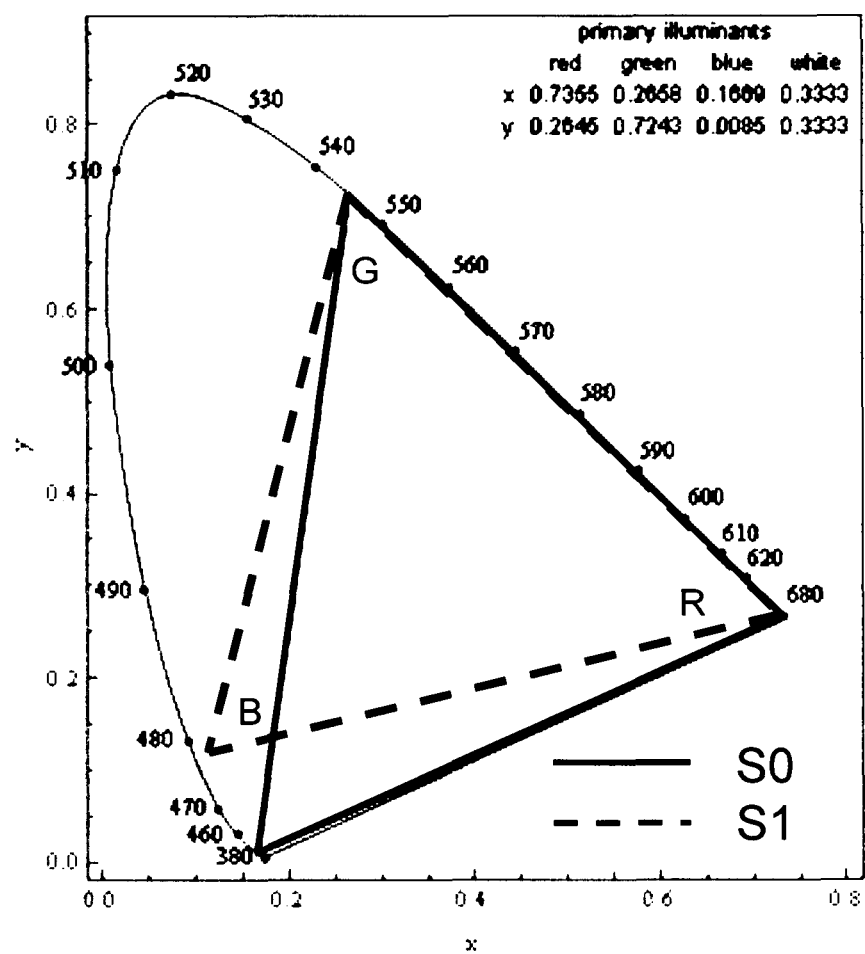
FIG. 11 is a view showing the relationship between the chromaticity coordinates (x, y) in accordance with the CIE1931 standard and the wavelength of light.

As indicated by the CIE1931 chromaticity diagram shown in FIG. 11, the amount of change in wavelength of light and the amount of change in CIEy value do not have a linear relationship in the blue wavelength region.

Specifically, the amount of change in CIEy value when the wavelength of light changes from 480 nm to 460 nm significantly differs from that when the wavelength of light changes from 500 nm to 480 nm. Therefore, even if the amount of change in CIEy value that is 0.08 or less in the blue emission region is a change in two places of decimals, the amount of change in the energy of light is very large. This suggests that it is difficult to decrease the CIEy value in the blue emission region.

Figure 7:
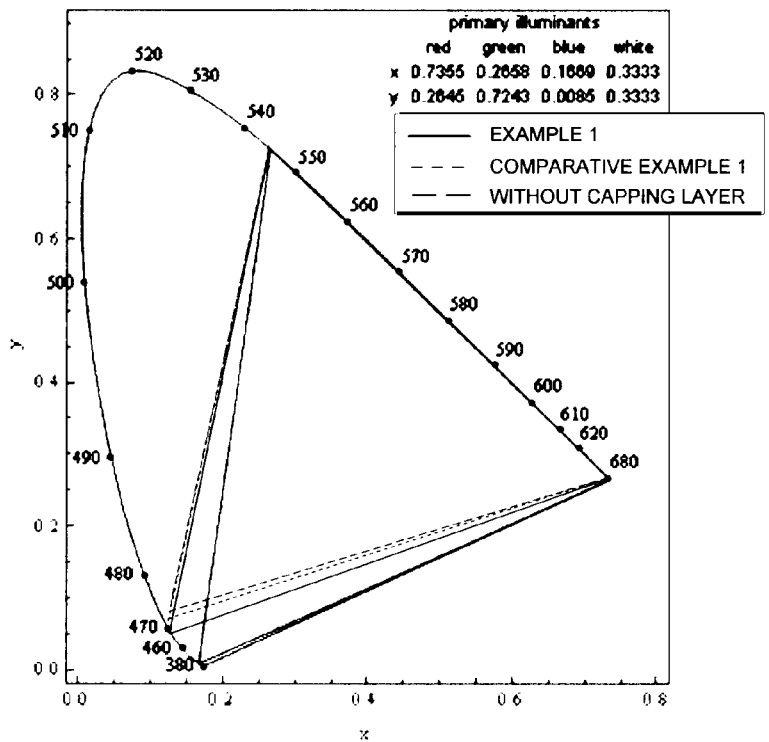
FIG. 7 is a view showing the chromaticity coordinates obtained in Example 1 and Comparative Example 1.

The color reproducibility can be improved when using blue-emitting device according to the invention as a blue pixel of a full-color device (see FIG. 7).

When using the blue-emitting device measured in Example 1 as the B pixel of an RGB image display, the chromaticity of the blue pixel required in accordance with the NTSC standard is satisfied.

Example 2

Figure 8:
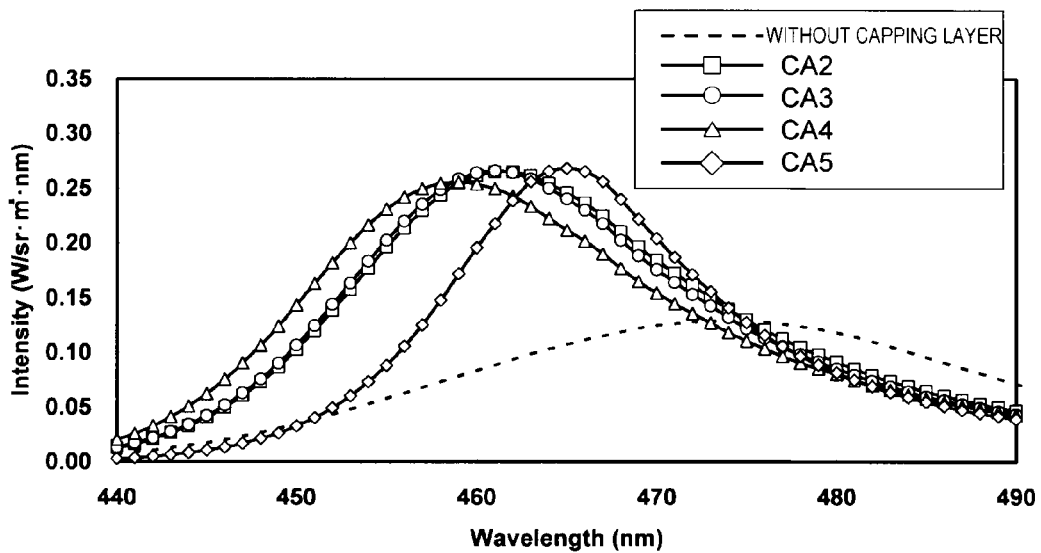
FIG. 8 is a view showing the EL spectrum measurement results obtained in Examples 2 to 4 and Comparative Example 2.

An organic EL device was fabricated and evaluated in the same manner as in Example 1, except that the thickness of the hole-injecting layer was changed to 110 nm, the material HT2 was used for the hole-transporting layer instead of the material HT1, the weight ratio of the materials BH and BD for forming the blue-emitting layer was changed to 18:2, and the capping layer was formed using the material CA2. Table 3 and FIG. 8 show the results for the device in which the capping layer was not formed, and the device in which the capping layer was formed and the CIEy value was minimized by optimizing the film thickness.

Example 3

An organic EL device was fabricated and evaluated in the same manner as in Example 2, except that the capping layer was formed using the material CA3. Table 3 and FIG. 8 show the results for the device in which the capping layer was not formed, and the device in which the capping layer was formed and the CIEy value was minimized by optimizing the film thickness.

Example 4

An organic EL device was fabricated and evaluated in the same manner as in Example 2, except that the capping layer was formed using the material CA4. Table 3 and FIG. 8 show the results for the device in which the capping layer was not formed, and the device in which the capping layer was formed and the CIEy value was minimized by optimizing the film thickness.

Comparative Example 2

An organic EL device was fabricated and evaluated in the same manner as in Example 2, except that the capping layer was formed using the material CA5. Table 3 and FIG. 8 show the results for the device in which the capping layer was not formed, and the device in which the capping layer was formed and the CIEy value was minimized by optimizing the film thickness.

TABLE 3

Table 3 Emission properties of Examples 2 to 4 and Comparative Example 2

| | | CIE1931 color coordinates | | | Peak wavelength | Peak intensity | (n, k) | (n, k) | |
|---|---|---|---|---|---|---|---|---|---|
| | | x | y | Δy | $\lambda_p$ (nm) | $I(\lambda_p)$ | ($\lambda$ = 430 nm) | ($\lambda$ = 460 nm) | Δn |
| Example 2 | CA2 | 0.117 | 0.112 | 0.044 | 474 | 0.13 | (2.12, 0.0) | (1.99, 0.0) | 0.13 |
| | | 0.133 | 0.068 | | 461 | 0.27 | | | |
| Example 3 | CA3 | 0.117 | 0.112 | 0.049 | 474 | 0.13 | (2.14, 0.0) | (1.99, 0.0) | 0.16 |
| | | 0.136 | 0.063 | | 459 | 0.27 | | | |
| Example 4 | CA4 | 0.117 | 0.112 | 0.047 | 474 | 0.13 | (2.08, 0.0) | (2.00, 0.0) | 0.09 |
| | | 0.134 | 0.065 | | 461 | 0.27 | | | |
| Com. Ex. 2 | CA5 | 0.117 | 0.112 | 0.026 | 474 | 0.13 | (2.38, 0.73) | (2.48, 0.16) | −0.10 |
| | | 0.133 | 0.086 | | 465 | 0.27 | | | |

$I(\lambda_p)$, (n, k), and Δn are rounded to the second decimal place.

The capping layer materials used in Example 2 (CA2), Example 3 (CA3), and Example 4 (CA4) satisfied the requirements recited in claim 1. On the other hand, the capping layer material used in Comparative Example 2 (CA5) had an extinction coefficient of 0 to 0.9 at a wavelength of 430 to 480 nm.

When using the capping layer materials CA2, CA3, and CA4, the outcoupling efficiency of blue light at a wavelength of 430 to 460 nm was high.

When using the capping layer material CA5, the outcoupling efficiency was improved at a wavelength of 465 nm or more. However, the outcoupling efficiency significantly decreased at a wavelength of 465 nm or less since the extinction coefficient was 0.1 or more.

Therefore, the capping layer material must have an extinction coefficient or 0.1 or less.

The results obtained when using the capping layer material CA1 and the results obtained when using the capping layer materials CA2, CA3, and CA4 are compared below. The CIEy value was 0.06 or less when using the capping layer material CA1, and the CIEy value was 0.06<y<0.07 when using the capping layer materials CA2, CA3, and CA4. This is because the CIEy value in the initial state (i.e., a state in which the capping layer was not provided) changed as a result of changing the device configuration. Specifically, the effects of the invention are achieved independently of the device configuration.

It was thus confirmed that an improvement in luminous efficiency, a decrease in peak wavelength, and a decrease in CIEy value (0.06 or less) can be achieved when using a material that satisfies "n(λ=430 nm)−n(λ=460 nm)>0.08" (where, n(λ=x nm) is the refractive index at a wavelength of x nm), and has an extinction coefficient of 0.1 or less at a wavelength of 430 to 780 nm as the material for the capping layer.

Note that the shift of the peak wavelength of the emission spectrum is not necessarily reflected directly in the amount of change in CIEy value. A decrease in CIEy value is limited when the shape of the peak of the blue emission spectrum is not sharp (particularly when the emission peak is broad in the long wavelength region). According to the invention, since a capping layer material that has a large amount of change in refractive index (n(λ=430 nm)−n(λ=460 nm)) is used, the short wavelength side of the emission spectrum can be selectively enhanced, and the CIEy value can be substantially decreased.

The structural formula of each material used to form the capping layer in Examples 5 to 11 and Comparative Example 3 is shown below.

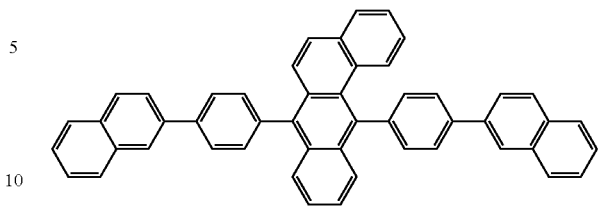
(CA7)

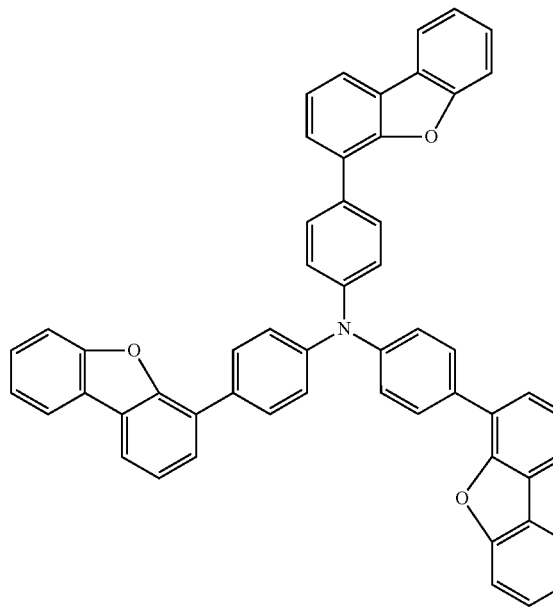
(CA8)

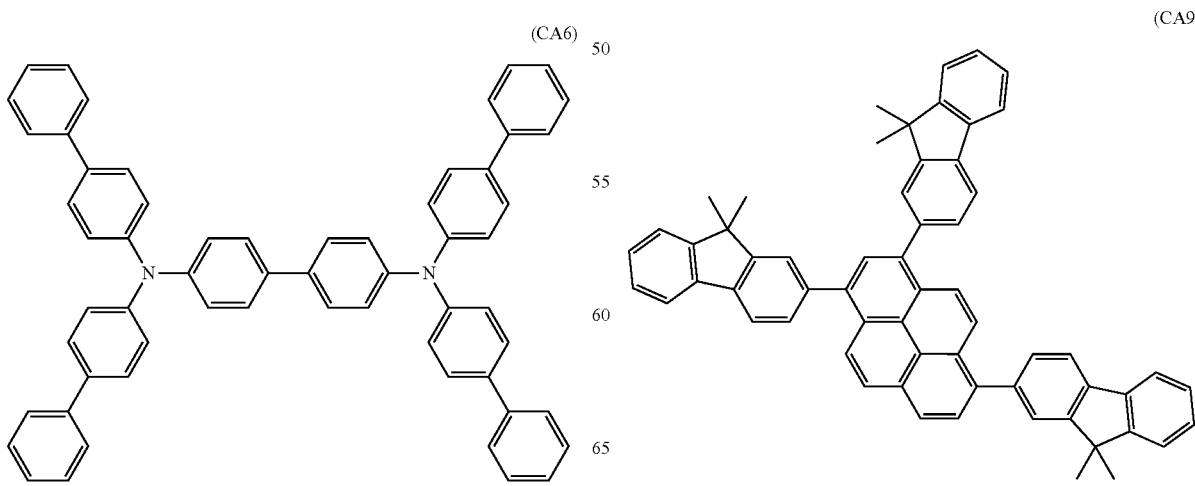
(CA6)

(CA9)

(CA10)

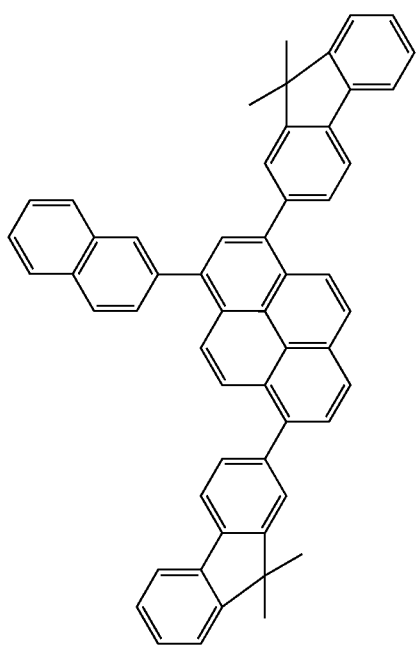

(CA11)

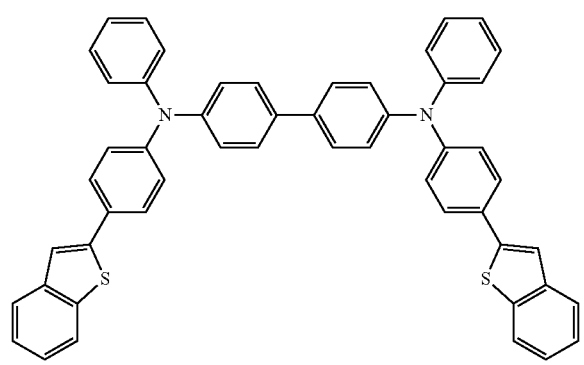

Figure 9A:
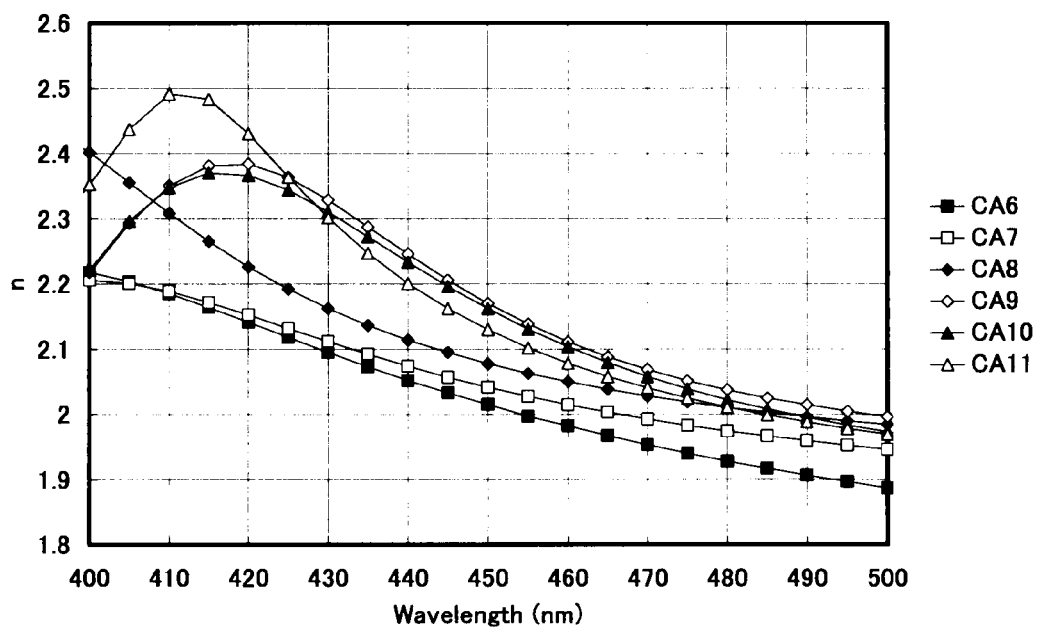
FIG. 9A is a view showing the wavelength dispersion of the refractive index of each material used in the examples and comparative examples.
Figure 9B:
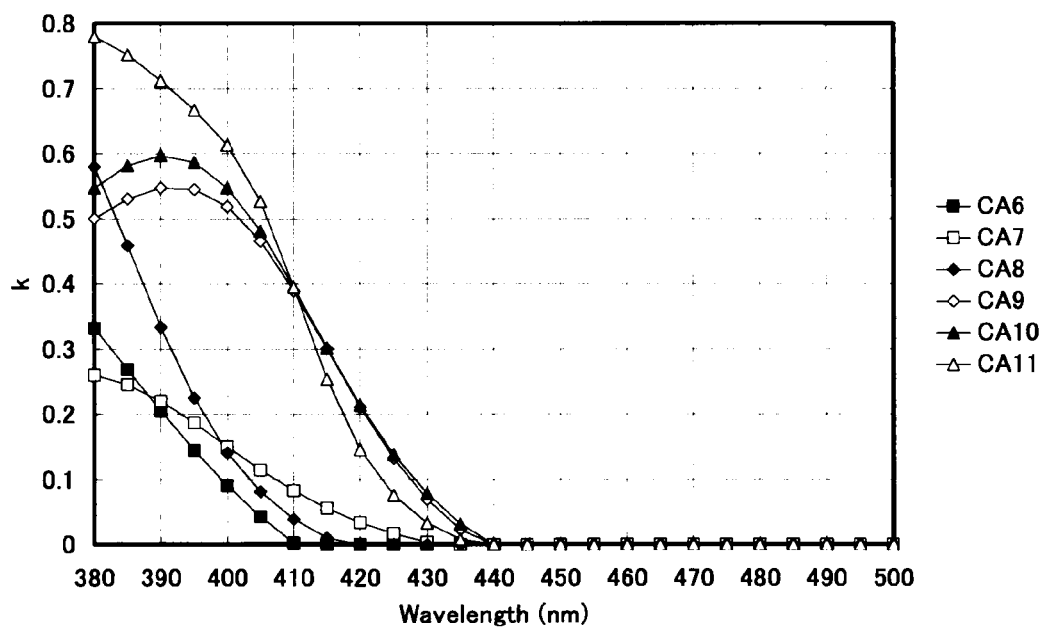
FIG. 9B is a view showing the extinction coefficient wavelength dispersion of each material used in the examples and comparative examples.

FIG. 9A and Table 4 show the wavelength dispersion of the refractive index (n) of each material (CA6 to CA11) used to form the capping layer in Examples 5 to 11 and Comparative Example 3, and FIG. 9B shows the wavelength dispersion of the extinction coefficient (k) of each material.

Example 5

Figure 9C:
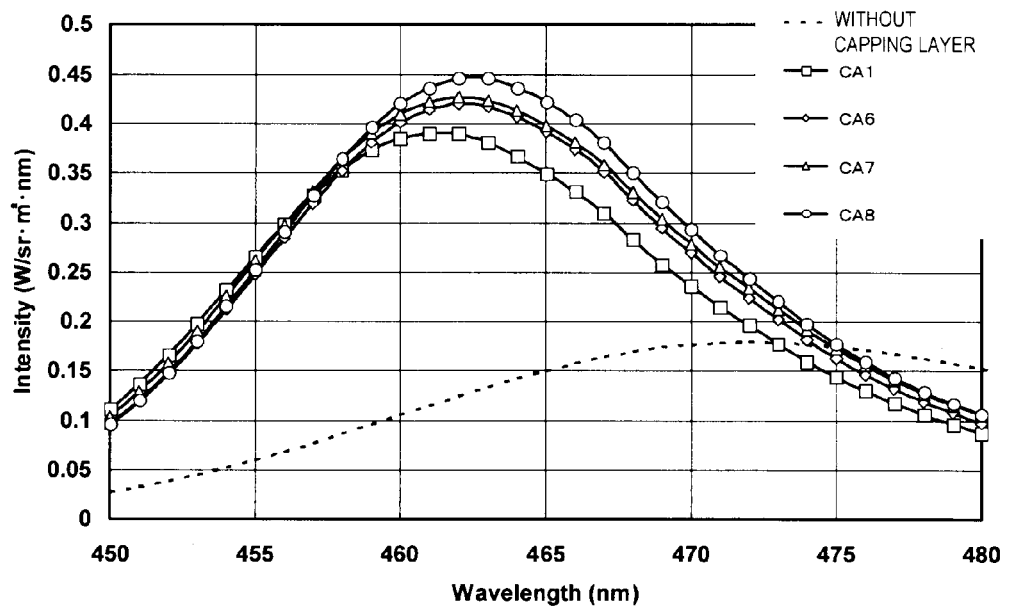
FIG. 9C is a view showing the EL spectrum measurement results obtained in Examples 5 to 8.

An organic EL device was fabricated and evaluated using the material HT3 as the hole-transporting material, using the material BH2 as the host material of the blue-emitting layer, using the material BD2 as the blue fluorescent dopant, using the material ET2 as the electron-transporting material, using the material ET3 as the electron-injecting material, and using the material CA1 as the capping layer material. Table 4 and FIG. 9C show the results for the device in which the capping layer was not formed, and the device in which the capping layer was formed and the CIEy value was minimized by optimizing the film thickness.

The organic EL device was fabricated as described below.

A zinc oxide (IZO) film (thickness: 10 nm), an Ag—Pd—Cu (APC) layer (silver alloy layer) (reflecting layer) (thickness: 100 nm), and a zinc oxide (IZO) film (thickness: 10 nm) were sequentially formed on a glass substrate (device substrate) by sputtering. The conductive material layer was patterned (etched) by lithographic technology using a resist pattern as a mask to form a lower electrode (anode). The glass substrate on which the lower electrode was formed was subjected to ultrasonic cleaning for 5 minutes in isopropyl alcohol, and then subjected to UV ozone cleaning for 30 minutes. The material HI was deposited on the lower electrode by vacuum deposition to a thickness of 110 nm to form a hole-injecting layer. The material HT2 was deposited on the hole-injecting layer to a thickness of 20 nm to form a hole-transporting layer. The materials BH2 and BD2 (weight ratio: 95:5) were deposited on the hole-transporting layer to a thickness of 20 nm to form a blue-emitting layer. The material ET2 was deposited on the blue-emitting layer to a thickness of 5 nm to form an electron-transporting layer 1. The material ET3 was deposited on the electron-transporting layer 1 to a thickness of 25 nm to form an electron-transporting layer 2. LiF was deposited on the electron-transporting layer 2 to a thickness of 0.5 nm to form an electron-injecting layer. Mg and Ag (thickness ratio: 9:1) were deposited on the electron-injecting layer to a thickness of 10 nm to form a semitransparent upper electrode (cathode) formed of an Mg—Ag alloy. A capping layer was formed over the entire surface of the upper electrode using the material CA1 to obtain an organic EL device.

The materials used in Example 5 are shown below.

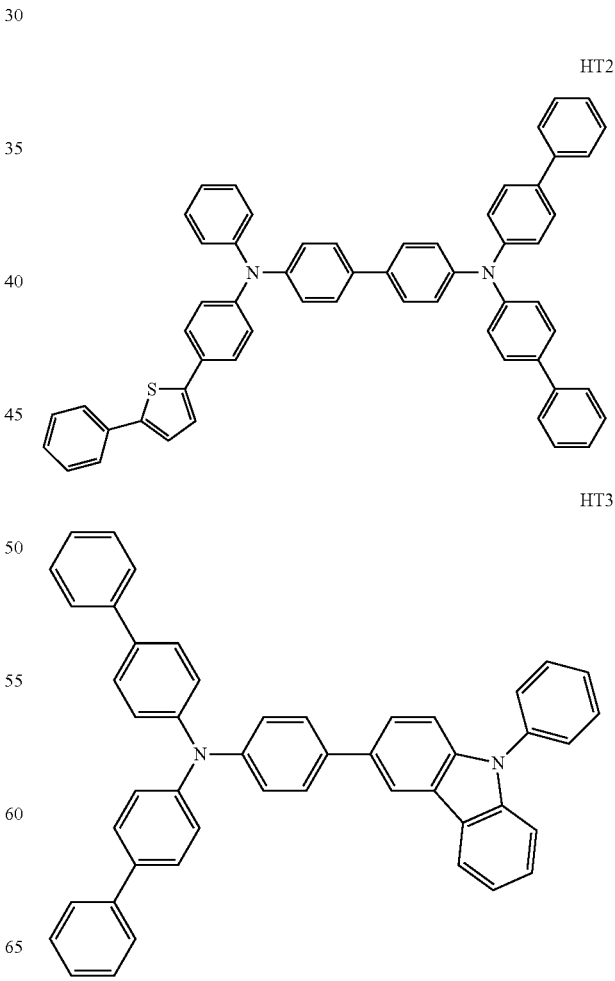

-continued

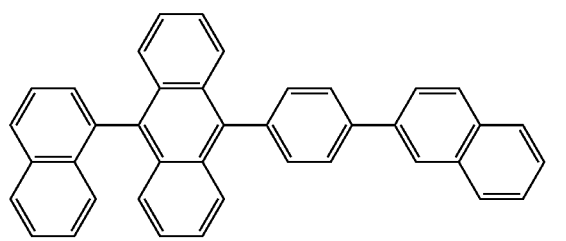

BH2

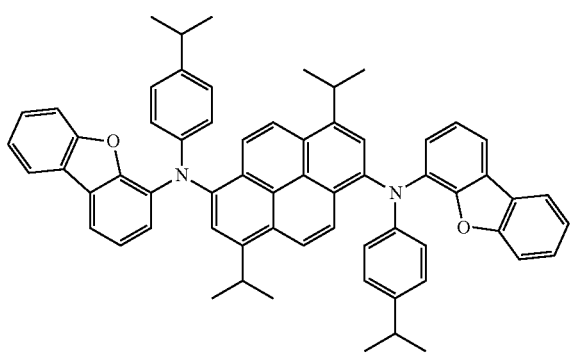

BD2

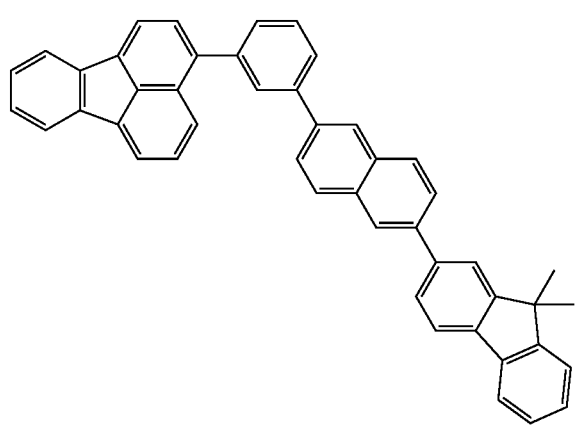

ET2

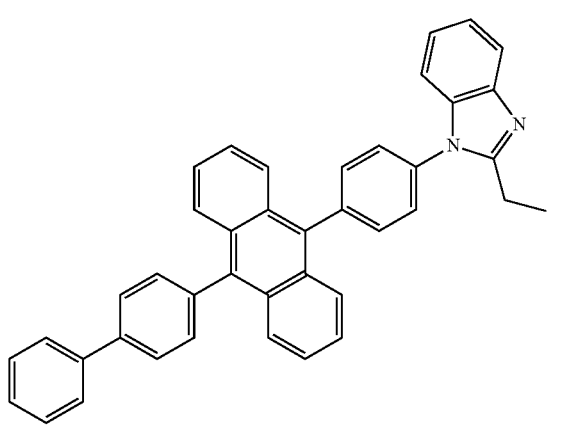

ET3

The blue fluorescent dopant used in Example 5 had a peak on the short wavelength side as compared with the dopant used in Example 1. The carrier-transporting material and the like were changed when fabricating the organic EL device. The capping layer of the organic EL device of Example 5 was designed so that the CIEy value was 0.06 and the error was within ±0.005 from the viewpoint of chromaticity adjustment.

Example 6

An organic EL device was fabricated and evaluated in the same manner as in Example 5, except that the capping layer was formed using the material CA6. Table 4 and FIG. 9C show the results for the device in which the capping layer was formed and the CIEy value was minimized by optimizing the film thickness.

Example 7

An organic EL device was fabricated and evaluated in the same manner as in Example 5, except that the capping layer was formed using the material CA7. Table 4 and FIG. 9C show the results for the device in which the capping layer was formed and the CIEy value was minimized by optimizing the film thickness.

Example 8

An organic EL device was fabricated and evaluated in the same manner as in Example 5, except that the capping layer was formed using the material CA8. Table 4 and FIG. 9C show the results for the device in which the capping layer was formed and the CIEy value was minimized by optimizing the film thickness.

Example 9

Figure 10:
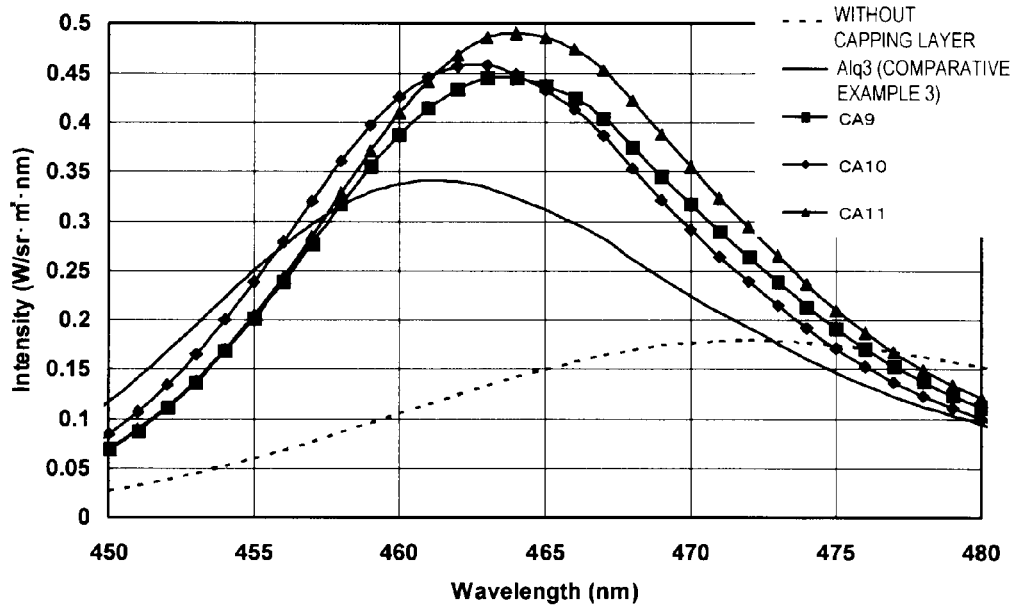
FIG. 10 is a view showing the EL spectrum measurement results obtained in Examples 9 to 11 and Comparative Example 3.

An organic EL device was fabricated and evaluated in the same manner as in Example 5, except that the capping layer was formed using the material CA9. Table 4 and FIG. 10 show the results for the device in which the capping layer was formed and the CIEy value was minimized by optimizing the film thickness.

Example 10

An organic EL device was fabricated and evaluated in the same manner as in Example 5, except that the capping layer was formed using the material CA10. Table 4 and FIG. 10 show the results for the device in which the capping layer was formed and the CIEy value was minimized by optimizing the film thickness.

Example 11

An organic EL device was fabricated and evaluated in the same manner as in Example 5, except that the capping layer was formed using the material CA11. Table 4 and FIG. 10 show the results for the device in which the capping layer was formed and the CIEy value was minimized by optimizing the film thickness.

Comparative Example 3

An organic EL device was fabricated and evaluated in the same manner as in Example 5, except that the capping layer was formed using Alq3. Table 4 and FIG. 10 show the results for the device in which the capping layer was formed and the CIEy value was minimized by optimizing the film thickness.

TABLE 4

Table 4 Emission properties of Examples 5 to 11 and Comparative Example 3

|  |  | CIE1931 color coordinates | | | Peak wavelength | Peak intensity | (n, k) | (n, k) |  |
|---|---|---|---|---|---|---|---|---|---|
|  |  | x | y | Δy | $\lambda_p$ (nm) | $I(\lambda_p)$ | ($\lambda$ = 430 nm) | ($\lambda$ = 460 nm) | Δn |
| Example 5 | CA1 | 0.114 | 0.117 | 0.060 | 472 | 0.18 | (2.00, 0.0) | (1.92, 0.0) | 0.08 |
|  |  | 0.135 | 0.057 |  | 461 | 0.39 |  |  |  |
| Example 6 | CA6 | 0.114 | 0.117 | 0.058 | 472 | 0.18 | (2.10, 0.0) | (1.98, 0.0) | 0.11 |
|  |  | 0.134 | 0.059 |  | 462 | 0.42 |  |  |  |
| Example 7 | CA7 | 0.114 | 0.117 | 0.056 | 472 | 0.18 | (2.11, 0.0) | (2.02, 0.0) | 0.10 |
|  |  | 0.134 | 0.061 |  | 462 | 0.43 |  |  |  |
| Example 8 | CA8 | 0.114 | 0.117 | 0.057 | 472 | 0.18 | (2.16, 0.0) | (2.05, 0.0) | 0.11 |
|  |  | 0.133 | 0.060 |  | 462 | 0.45 |  |  |  |
| Example 9 | CA9 | 0.114 | 0.117 | 0.054 | 472 | 0.18 | (2.33, 0.07) | (2.11, 0.0) | 0.22 |
|  |  | 0.132 | 0.063 |  | 463 | 0.45 |  |  |  |
| Example 10 | CA10 | 0.114 | 0.117 | 0.058 | 472 | 0.18 | (2.31, 0.08) | (2.10, 0.0) | 0.21 |
|  |  | 0.134 | 0.059 |  | 463 | 0.46 |  |  |  |
| Example 11 | CA11 | 0.114 | 0.117 | 0.055 | 472 | 0.18 | (2.30, 0.03) | (2.08, 0.0) | 0.22 |
|  |  | 0.131 | 0.062 |  | 464 | 0.49 |  |  |  |
| Com. Ex. 3 | Alq3 | 0.114 | 0.117 | 0.054 | 472 | 0.18 | (1.86, 0.0) | (1.81, 0.0) | 0.05 |
|  |  | 0.134 | 0.063 |  | 461 | 0.34 |  |  |  |

$I(\lambda_p)$, (n, k), and Δn are rounded to the second decimal place.

When the capping layer was designed so that the CIEy value was 0.06 and the error was within ±0.005, the peak intensity of the emission spectrum in Comparative Example 3 (Alq3) was 0.34, while the peak intensity was 0.39 or more when using a material that ensured that the amount of change in refractive index of the capping layer was 0.08 or more at a wavelength of 430 to 460 nm (Examples 5 to 11). In Example 11 in which the material having an amount of change in refractive index (n(430 nm)–n(460 nm)) of 0.22 was used, a high peak intensity of 0.49 was achieved.

In Example 9 and Comparative Example 3, the CIEy values were 0.063. However, the peak intensity achieved in Example 9 (CA9) was 0.45, and the peak intensity achieved in Comparative Example 3 (Alq3) was 0.34.

The capping layer shifts the peak wavelength, and increases the intensity. As is clear from the comparison between the material CA9 and Alq3, the material CA9 is suitable for a blue-emitting device that exhibits a small CIEy value and high luminous intensity as compared with Alq3.

As is clear from the results for Examples 5 to 11, the peak intensity of the emission spectrum increases (i.e., positive correlation) when using a capping layer material that exhibits a normal refractive index dispersion and a large amount of change in refractive index at a wavelength of 430 to 460 nm when fabricating a top-emission device in which the capping layer is designed so that the CIEy value is 0.06.

In Examples 1 to 4, the amount of change in refractive index of the capping layer material and a decrease in CIEy value had a positive correlation. In Examples 5 to 11 in which the CIEy value was adjusted to 0.06, the amount of change in refractive index of the capping layer material and an increase in peak intensity had a positive correlation.

These results were obtained since the capping layer exhibited a normal refractive index dispersion, and the amount of change in refractive index (n(430 nm)–n(460 nm)) was 0.08 or more.

INDUSTRIAL APPLICABILITY

The organic EL device according to the invention may be used as a planar emitting device (e.g., a flat panel display of a wall TV), a backlight of a copier, a printer, or a liquid crystal display, a light source of an instrument (meter), a signboard, a marker lamp (light), and the like.

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

The documents described in the specification are incorporated herein by reference in their entirety.

The invention claimed is:

1. A top-emission organic electroluminescence device, comprising, in the following order:
   a substrate;
   a first electrode;
   an organic layer comprising a blue-emitting layer;
   a second electrode; and
   a capping layer,
   wherein:
   the capping layer comprises a material having (i) an extinction coefficient of 0.1 or less at a wavelength of 430 to 500 nm, and (ii) an amount of change in refractive index that satisfies an expression (1):

$$n(\lambda=430\text{ nm})-n(\lambda=460\text{ nm}) > 0.08 \qquad (1),$$

wherein, n($\lambda$=x nm) is a refractive index at a wavelength of x nm;
   the organic layer further comprises a red-emitting layer and a green-emitting layer; and
   a blue pixel, a red pixel, and a green pixel are disposed on a common substrate, and the capping layer is provided common to the blue pixel, the red pixel, and the green pixel.

2. The device of claim 1, wherein the second electrode comprises a metal.

3. The device of claim 1, wherein the capping layer has a thickness of 200 nm or less.

4. The device of claim 1, wherein the blue-emitting layer comprises an emitting material having a peak wavelength of a photoluminescence (PL) spectrum of 430 to 500 nm.

5. The device of claim 1, wherein the second electrode has a transmittance of 20% or more at a wavelength of 430 to 500 nm.

6. The device of claim 1, wherein the material in the capping layer comprises a compound satisfying expression (1) selected from the group consisting of
an aromatic hydrocarbon compound comprising a carbon atom and a hydrogen atom, optionally substituted with a substituent optionally comprising an oxygen atom, a nitrogen atom, a fluorine atom, a silicon atom, a chlorine atom, a bromine atom, or an iodine atom,
an aromatic heterocyclic compound comprising a carbon atom and a hydrogen atom, optionally substituted with a substituent optionally comprising an oxygen atom, a nitrogen atom, a fluorine atom, a silicon atom, a chlorine atom, a bromine atom, or an iodine atom, and
an amine compound comprising a carbon atom and a hydrogen atom, optionally substituted with a substituent optionally comprising an oxygen atom, a nitrogen atom, a fluorine atom, a silicon atom, a chlorine atom, a bromine atom, or an iodine atom.

7. The device of claim 1, wherein the capping layer comprises a compound of formula (11):

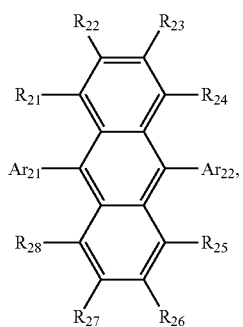

(11)

wherein:
$A_{21}$ and $A_{22}$ are each independently a substituted or unsubstituted aromatic ring group comprising 6 to 60 carbon atoms; and
$R_{21}$ to $R_{28}$ are each independently a hydrogen atom, a substituted or unsubstituted aromatic ring group comprising 6 to 50 carbon atoms, a substituted or unsubstituted aromatic heterocyclic group comprising 5 to 50 atoms, a substituted or unsubstituted alkyl group comprising 1 to 50 carbon atoms, a substituted or unsubstituted cycloalkyl group, a substituted or unsubstituted alkoxy group comprising 1 to 50 carbon atoms, a substituted or unsubstituted aralkyl group comprising 6 to 50 carbon atoms, a substituted or unsubstituted aryloxy group comprising 5 to 50 atoms, a substituted or unsubstituted alkoxycarbonyl group comprising 1 to 50 carbon atoms, a substituted or unsubstituted silyl group, a carboxyl group, a halogen atom, a cyano group, a nitro group, or a hydroxy group.

8. The device of claim 2, wherein the metal is at least one selected from the group consisting of Ag, Mg, Al, Ca, and an alloy thereof.

9. The device of claim 8, wherein the second electrode has a thickness of 30 nm or less.

10. The device of claim 8, wherein the capping layer has a thickness of 40 to 140 nm.

11. The device of claim 1, wherein, in expression (1), the amount of change in refractive index is more than 0.08 and 1.0 or less.

12. The device of claim 11, wherein, in expression (1), the amount of change in refractive index is between 0.1 and 1.0.

13. The device of claim 12, wherein, in expression (1), the amount of change in refractive index is between 0.12 and 1.0.

14. The device of claim 1, wherein the red-emitting layer and the green-emitting layer each comprising a host material and a dopant material.

15. The device of claim 14, wherein:
the red-emitting layer host material is selected from the group consisting of a naphthcene derivative, a pentacene derivative, a naphthalene compound, a phenanthrene compound, and a fluoranthene compound; and
the red-emitting layer dopant material is selected from the group consisting of a fused aromatic ring comprising a substituted or unsubstituted arylamino group and a metal complex.

16. The device of claim 14, wherein:
the green-emitting layer host material is selected from the group consisting of an anthracene derivative, a pyrene derivative, a carbazole derivative, a dibenzofuran derivative, a ladder furan compound, and a pyrimidine derivative; and
the green-emitting layer dopant material is selected from the group consisting of (i) a fused aromatic ring derivative comprising a substituted or unsubstituted pyrene group, anthracene group, and chrysene group, (ii) a styrylamine compound, (iii) a boron complex, (iv) a fluoranthene compound, and (iv) a metal compound.

* * * * *